(12) United States Patent
Martin

(10) Patent No.: US 10,978,347 B2
(45) Date of Patent: Apr. 13, 2021

(54) DEVICE CHIP AND METHOD OF MANUFACTURING DEVICE CHIP

(71) Applicant: DISCO CORPORATION, Tokyo (JP)

(72) Inventor: Devin Martin, San Jose, CA (US)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/571,800

(22) Filed: Sep. 16, 2019

(65) Prior Publication Data
US 2021/0082760 A1    Mar. 18, 2021

(51) Int. Cl.
| | |
|---|---|
| *H01L 21/78* | (2006.01) |
| *H01L 23/00* | (2006.01) |
| *H01L 23/498* | (2006.01) |
| *H01L 21/304* | (2006.01) |
| *H01L 21/3065* | (2006.01) |

(52) U.S. Cl.
CPC .......... *H01L 21/78* (2013.01); *H01L 21/3043* (2013.01); *H01L 21/3065* (2013.01); *H01L 23/4985* (2013.01); *H01L 24/08* (2013.01)

(58) Field of Classification Search
CPC ...... H01L 21/78; H01L 23/4985; H01L 24/08
See application file for complete search history.

(56) References Cited

U.S. PATENT DOCUMENTS

| | | | | |
|---|---|---|---|---|
| 2003/0209772 A1* | 11/2003 | Prabhu | .............. | H01L 27/14618 257/434 |
| 2006/0068566 A1* | 3/2006 | Ametani | ........... | H01L 21/67132 438/459 |
| 2008/0029879 A1* | 2/2008 | Tuckerman | ......... | B81C 1/00301 257/704 |

FOREIGN PATENT DOCUMENTS

JP    2018142598 A    9/2018

* cited by examiner

*Primary Examiner* — William Coleman
(74) *Attorney, Agent, or Firm* — Greer Burns & Crain,, Ltd.

(57) ABSTRACT

A device chip for mounting on a board is provided. The device chip includes a top surface, an undersurface located on an opposite side from the top surface and having a larger area than the top surface, a slope inclined with respect to the top surface and the undersurface and exposed to the top surface side, a circuit portion on the top surface side, the circuit portion including an electronic circuit, and a wiring portion on which wiring electrically connecting the circuit portion and the board to each other is to be formed, the wiring portion including the slope in a part of the wiring portion.

20 Claims, 16 Drawing Sheets

DEVICE CHIP AND METHOD OF MANUFACTURING DEVICE CHIP

BACKGROUND OF THE INVENTION

Field of the Invention

The present invention relates to a device chip for mounting on a board and a method of manufacturing the device chip.

Description of the Related Art

In various kinds of electronic apparatuses typified by mobile phones, a device chip including a device such as an electronic circuit or the like is an essential constituent element. Device chips are obtained by, for example, demarcating the top surface of a wafer as a base material into a plurality of regions by planned dividing lines referred to as streets, forming devices in the respective regions, and thereafter dividing the wafer along the planned dividing lines.

When the thickness of a device chip as described above is reduced, the flexibility of the device chip is increased. Hence, it is considered that a highly flexible electronic apparatus can be realized by mounting a sufficiently thin device chip on a flexible board typified by a film made of a resin.

In recent years, a technology of forming wiring and an insulating film on a flexible board by a method such as printing or the like has been put to practical use (see Japanese Patent Laid-Open No. 2018-142598, for example). In addition, under consideration is formation of wiring for connection between the device chip and the flexible board by a method such as printing or the like by using such a technology.

SUMMARY OF THE INVENTION

However, when an ordinary device chip having a rectangular parallelepipedic shape is disposed on the flexible board, a level difference occurs between an edge portion of the device chip and the flexible board. It has therefore been difficult to form highly reliable wiring connecting the device chip and the flexible board to each other by a method such as printing or the like.

It is accordingly an object of the present invention to provide a device chip suitable for formation of wiring by a method such as printing or the like and a method of manufacturing the device chip.

In accordance with an aspect of the present invention, there is provided a device chip for mounting on a board, the device chip including: a top surface; an undersurface located on an opposite side from the top surface and having a larger area than the top surface; a slope inclined with respect to the top surface and the undersurface and exposed to the top surface side; a circuit portion on the top surface side, the circuit portion including an electronic circuit; and a wiring portion on which wiring electrically connecting the circuit portion and the board to each other is to be formed, the wiring portion including the slope in a part of the wiring portion.

In the device chip according to the aspect of the present invention, the slope can be connected to the top surface and the urdersurface.

In addition, the device chip according to the aspect of the present invention can have a shape of a rectangle as viewed from the top surface side, and the wiring portion can be disposed in a part corresponding to one side of the rectangle.

According to another aspect of the present invention, there is provided a method of manufacturing a device chip for mounting on a board, the method including: preparing a wafer having a circuit portion including an electronic circuit in each of a plurality of regions on a side of a top surface demarcated by planned dividing lines; forming, in the wafer, a groove including a slope inclined with respect to the top surface and connected to the top surface by cutting the planned dividing lines of the wafer from the top surface side by an end portion of a cutting blade having, at the end portion of the cutting blade, an outer circumferential surface inclined with respect to a side surface; and forming the device chip including the slope, the slope being inclined with respect to the top surface and an undersurface located on an opposite side from the top surface of the wafer in which the groove is formed, and the slope being exposed to the top surface side, by thinning the wafer until the slope of the groove and the undersurface are connected to each other and dividing the wafer along the planned dividing lines by grinding the undersurface.

According to yet another aspect of the present invention, there is provided a method of manufacturing a device chip for mounting on a board, the method including: preparing a wafer having a circuit portion including an electronic circuit in each of a plurality of regions on a side of a top surface demarcated by planned dividing lines; forming, in the wafer, a groove including a slope inclined with respect to the top surface and connected to the top surface by cutting the planned dividing lines of the wafer from the top surface side by an end portion of a cutting blade having, at the end portion of the cutting blade, an outer circumferential surface inclined with respect to a side surface; thinning the wafer by grinding an undersurface located on an opposite side from the top surface of the wafer in which the groove is formed; and forming the device chip including the slope inclined with respect to the top surface and the undersurfacs and exposed to the top surface side by dividing tha wafer along the planned dividing lines such that the slope of the groove of the ground wafer and the undersurface of the ground wafer are connected to each other.

In the above-described method of manufacturing the device chip, the wafer can be divided along the planned dividing lines by processing the undersurface of the ground wafer by etching.

In addition, according to another aspect of the present invention, there is provided a method of manufacturing a device chip for mounting on a board, the method including: preparing a wafer having a circuit portion including an electronic circuit in each of a plurality of regions on a side of a top surface demarcated by planned dividing lines; forming, in the wafer, a first groove including a slope inclined with respect to the top surface and connected to the top surface by cutting the planned dividing lines of the wafer from the top surface side by an end portion of a first cutting blade having, at the end portion of the first cutting blade, an outer circumferential surface inclined with respect to a side surface; forming, in the wafer, a second groove having a smaller width than the first groove and reaching a position deeper from the top surface than the first groove by cutting the planned dividing lines of the wafer from the top surface side by a second cutting blade having a smaller width than the end portion of the first cutting blade; and forming the device chip including the slope, the slope being inclined with respect to the top surface and an undersurface located on an opposite side from the top surface of the wafer in which the first groove and the second groove are formed, and the slope being exposed to the top surface side, by thinning the wafer and dividing the wafer along the planned dividing lines by grinding the undersurface.

In the method of manufacturing the device chip according to each aspect of the present invention, further, the slope of the groove of the wafer in which the groove is formed can be processed by etching.

The device chip according to the aspect of the present invention has the top surface, the undersurface having a larger area than the top surface, and the slope inclined with respect to the top surface and the undersurface and exposed to the top surface side. Therefore, when the device chip is disposed on a board such that the top surface and the slope are exposed, almost no level difference occurs between the circuit portion on the top surface side and the slope and between the slope and the board.

Hence, the circuit portion including the electronic circuit and the board can be reliably connected to each other by merely forming wiring on the wiring portion including the slope by a method such as printing or the like. Thus, the device chip according to the aspect of the present invention is suitable for formation of wiring by a method such as printing or the like.

In addition, in the method of manufacturing the device chip according to each aspect of the present invention, the groove including the slope is formed in the wafer by cutting the planned dividing lines of the wafer from the top surface side by the end portion of the cutting blade having an inclined outer circumferential surface at the end portion of the cutting blade, and thereafter the wafer is divided. Therefore, the device chip having the slope inclined with respect to the top surface and the undersurface and exposed to the top surface side can be obtained reliably.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
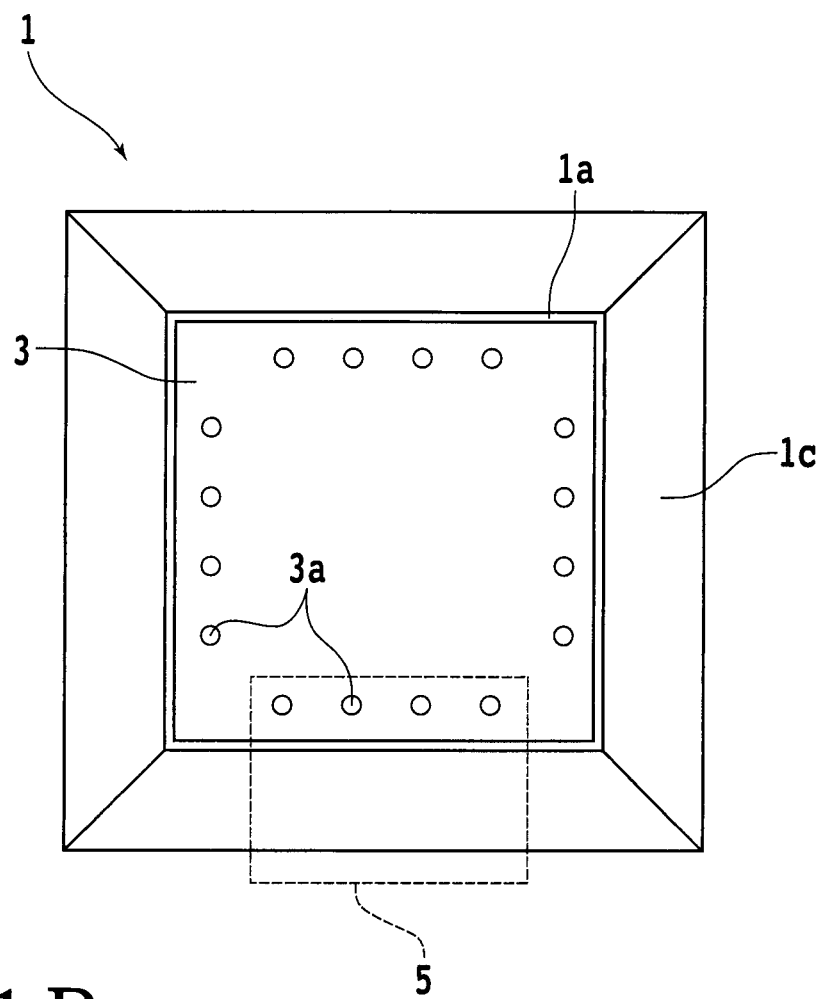
FIG. 1A is a plan view of a device chip.
Figure 1B:
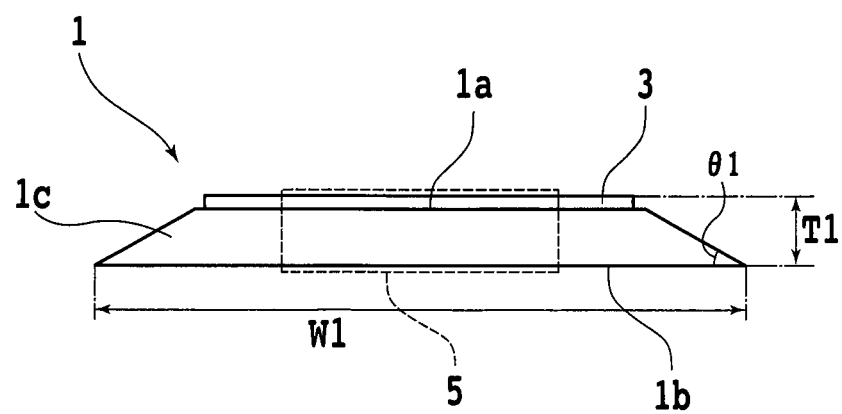
FIG. 1B is a side view of the device chip.

An embodiment of the present invention will be described with reference to the accompanying drawings. FIG. 1A is a plan view of a device chip according to the present embodiment. FIG. 1B is a side view of the device chip. As depicted in FIG. 1A and FIG. 1B, the device chip 1 is, for example, a plate-shaped part including a semiconductor material such as silicon or the like, and includes a top surface 1a and an undersurface 1b located on an opposite side from the top surface 1a.

The top surface 1a and the undersurface 1b are each formed in substantially a flat rectangular shape. In addition, the top surface 1a and the undersurface 1b are arranged substantially in parallel with each other. The area of the undersurface 1b is larger than the area of the top surface 1a. That is, the area of the top surface 1a is smaller than the area of the undersurface 1b.

A part of an edge of the undersurface 1b, the edge corresponding to one of four sides of the rectangle, is disposed on the side of a part of an edge of the top surface 1a, the edge corresponding to one of four sides of the rectangle. The part of the edge of the top surface 1a and the part of the edge of the undersurface 1b are parallel with each other. The part of the edge of the top surface 1a and the part of the edge of the undersurface 1b are connected to each other by a slope 1c inclined with respect to the top surface 1a and the undersurface 1b.

That is, a part of an edge of the slope 1c inclined with respect to the top surface 1a and the undersurface 1b is connected to the part of the edge of the top surface 1a, the edge corresponding to one side of the rectangle. In addition, another part of an edge of the slope 1c inclined with respect to the top surface 1a and the undersurface 1b is connected to the part of the edge of the undersurface 1b, the edge corresponding to one side of the rectangle. The slope 1c is formed so as to be substantially flat, and is exposed only to the top surface 1a side.

Respective parts of edges of the undersurface 1b, the edges corresponding to other three sides of the rectangle, are also arranged on the sides of respective parts of edges of the top surface 1a, the edges corresponding to other three sides of the rectangle. The respective parts of the edges of the top surface 1a are parallel with the respective parts of the edges of the undersurface 1b. The respective parts of the edges of the top surface 1a and the respective parts of the edges of the undersurface 1b are connected to each other by similar slopes 1c. That is, the device chip 1 is formed in the shape of a truncated quadrangular pyramid whose shape as viewed from the top surface 1a side or the undersurface 1b side is rectangular, and the device chip 1 includes four slopes 1c constituting side walls.

A circuit portion (device) 3 including an electronic circuit is provided on the top surface 1a side of the device chip 1. The circuit portion 3 includes a plurality of terminals 3a exposed to the outside. The plurality of terminals 3a are arranged along the respective parts of the edges of the top surface 1a, the edges corresponding to the four sides of the rectangle. When the device chip 1 is mounted on a flexible board, the terminals 3a of the circuit portion 3 are electrically connected to terminals on the flexible board via wiring.

Together with a region corresponding to the terminals 3a of the circuit portion 3, a part of the slope 1c constitutes a wiring portion 5 on which wiring is formed when the device chip 1 is mounted on the flexible board. It is to be noted that while FIG. 1A and FIG. 1B depict only the wiring portion 5 corresponding to one slope 1c for the convenience of description, the device chip 1 according to the present embodiment has a plurality of wiring portions 5 corresponding to the respective slopes 1c.

Thus, the device chip 1 according to the present embodiment has the plurality of slopes 1c inclined with respect to the top surface 1a and the undersurface 1b and exposed to the top surface 1a side. In addition, each of the slopes 1c is connected to the top surface 1a and the undersurface 1b. Therefore, when the device chip 1 is disposed on the flexible board so as to expose the top surface 1a and the slope 1c, almost no level difference occurs between the circuit portion 3 on the top surface 1a side and the slope 1c and between the slope 1c and the flexible board.

Hence, unlike a case of using a device chip having a rectangular parallelepipedic shape (a device chip having only side surfaces substantially perpendicular to a top surface and an undersurface), the circuit portion 3 including the electronic circuit and the flexible board can be reliably connected to each other by merely forming wiring on the wiring portion 5 including the slope 1c by a method such as printing or the like. Thus, the device chip 1 according to the present embodiment is suitable for formation of wiring by a method such as printing or the like.

There is no particular limitation on an angle θ1 formed between the undersurface 1b and the slope 1c of the device chip 1. However, when the angle θ1 is decreased, the area of the wiring portion 5 is relatively increased with respect to the area of the circuit portion 3, and the circuit portion 3 having a sufficient area cannot be secured. In addition, when the angle θ1 is increased, a level difference tends to occur, and excellent wiring cannot be formed on the wiring portion 5 by the method such as printing or the like. Hence, the angle θ1 is, for example, set between 20° and 70° both inclusive, preferably set batween 30° and 60° both inclusive, more preferably set between 35° and 55° both inclusive.

Incidentally, the width W1 of the device chip 1 (the length of the undersurface 1b which length corresponds to one side of the rectangle) is, for example, 0.5 μm to 5 mm, and the thickness (finished thickness) T1 of the device chip 1 is, for example, 10 μm to 50 μm. However, the width W1 of the device chip 1, the thickness T1 of the device chip 1, and the like are not particularly limited either.

Figure 2A:
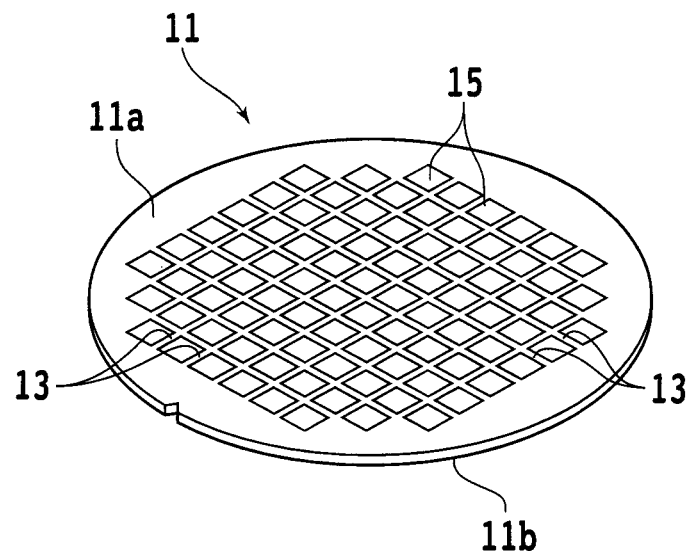
FIG. 2A is a perspective view of a wafer.
Figure 2B:
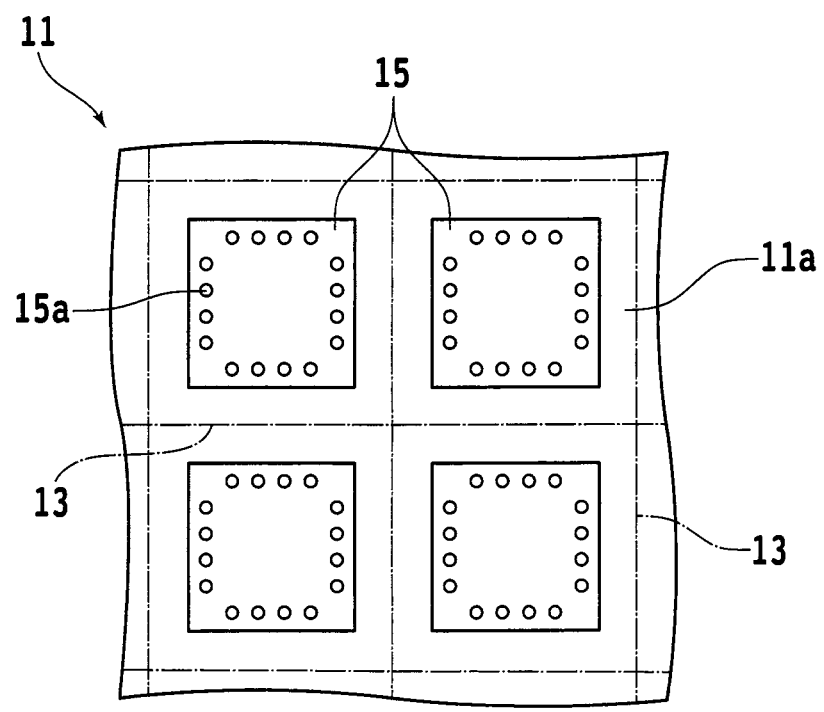
FIG. 2B is a plan view in which a part of the top surface side of the wafer is enlarged.

A method of manufacturing the above-described device chip 1 will next be described in detail. In the method of manufacturing the device chip according to the present embodiment, a wafer is first prepared which has a circuit portion (device) in each of a plurality of regions on a top surface side demarcated by planned dividing lines (preparing step). FIG. 2A is a perspective view of the wafer used in the method of manufacturing the device chip according to the present embodiment. FIG. 2B is a plan view in which a part of the top surface side of the wafer is enlarged.

As depicted in FIG. 2A, the wafer 11 according to the present embodiment is, for example, formed in a disk shape by using a semiconductor material such as silicon or the like, and includes a top surface 11a and an undersurface 11b located on an opposite side from the top surface 11a. The top surface 11a side of the wafer 11 is demarcated into a plurality of small regions by a plurality of planned dividing lines (streets) 13 intersecting each other. A circuit portion (device) 15 including an electronic circuit is formed in each small region.

An outermost layer (topmost layer) of each circuit portion 15 is typically formed by an insulative protective film (passivation film). In addition, as depicted in FIG. 2B, each circuit portion 15 includes a plurality of terminals 15a whose upper ends are exposed to the outside. The above-described device chip 1 is obtained by processing the wafer 11. The circuit portions 15 of the wafer 11 correspond to the circuit portion 3 of the device chip 1, and the terminals 15a of the wafer 11 correspond to the terminals 3a of the device chip 1.

It is to be noted that while the disk-shaped wafer 11 including a semiconductor material such as silicon or the like is used in the present embodiment, there is no limitation on the material, shape, structure, size, or the like of the wafer 11. For example, a substrate including a material such as another semiconductor, a ceramic, a resin, a metal, or the like can also be used as the wafer 11. Similarly, there is no limitation on the kind, quantity, shape, structure, size, arrangement, or the like of the circuit portions 15 either.

Figure 3A:
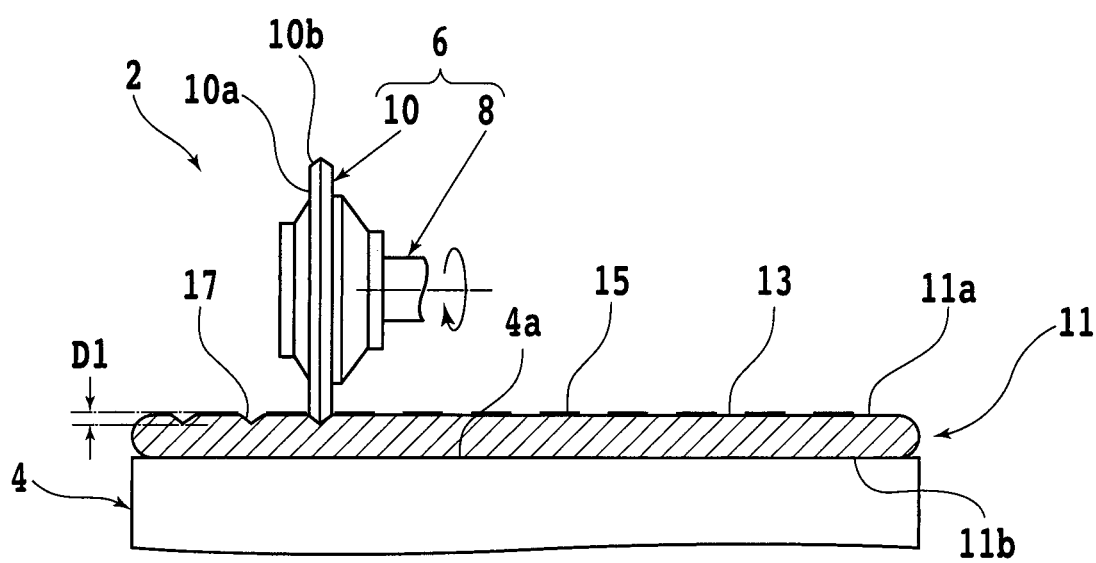
FIG. 3A is a diagram schematically depicting a manner in which grooves are formed on the top surface side of the wafer.

After the wafer 11 is prepared, grooves including slopes (inclined side surfaces) are formed on the top surface 11a side of the wafer 11 by cutting the planned dividing lines 13 of the wafer 11 by a cutting blade (cutting step). FIG. 3A is a diagram schematically depicting a manner in which grooves are formed in the wafer 11. In the present embodiment, grooves 17 are formed in the wafer 11 by using a cutting apparatus 2 of FIG. 3A.

The cutting apparatus 2 includes a chuck table 4 used at a time of holding the wafer 11. The chuck table 4, for example, includes a cylindrical frame body formed of a metallic material typified by a stainless steel and a holding plate formed of a porous material and disposed on an upper portion of the frame body. The upper surface of the holding plate constitutes a holding surface 4a holding the wafer 11.

The lower surface side of the holding plate is connected to a suction source (not depicted) via a flow passage provided within the frame body or the like. The flow passage or the like is provided with a valve (not depicted) that controls a flow of fluid. Therefore, when the valve is opened, the wafer 11 can be sucked by making a negative pressure of the suction source act on the holding surface 4a.

The frame body of the chuck table 4 is coupled to a rotation-driving source (not depicted) such as a motor or the like. A force produced by the rotation-driving source rotates the frame body of the chuck table 4 about a rotational axis substantially perpendicular to the above-described holding surface 4a. In addition, the frame body of the chuck table 4 is supported by a moving mechanism (not depicted), and is moved in a first direction (processing feed direction) substantially parallel with the above-described holding surface 4a.

A cutting unit 6 is disposed above the chuck table 4. The cutting unit 6, for example, includes a tubular spindle housing (not depicted). Housed in a space inside the spindle housing is a spindle 9 as a rotational axis substantially parallel with the holding surface 4a of the chuck table 4 and substantially perpendicular to the first direction. An annular cutting blade 10 formed by fixing abrasive grains such as diamond or the like by a bonding material such as a resin, a metal, or the like is fitted to one end side of the spindle 8.

The cutting blade 10, for example, includes a pair of side surfaces 10a that are substantially flat and parallel with each other. The cutting blade 10 is fitted to the one end side of the spindle 8 such that the pair of side surfaces 10a is perpendicular to the rotational axis. That is, the pair of side surfaces 10a of the cutting blade 10 is substantially perpendicular to the holding surface 4a of the chuck table 4, and is substantially parallel with the first direction.

In addition, a pair of outer circumferential surfaces 10b inclined with respect to the pair of side surfaces 10a is provided to an end portion corresponding to the outer peripheral edge of the cutting blade 10. Each outer circumferential surface 10b is formed in the shape of a curved surface corresponding to the side surface of a circular truncated cone. An edge of one end side of the outer circumferential surface 10b is connected with an edge of the corresponding side surface 10a. In addition, an edge on another end side of one outer circumferential surface 10b and an edge on another end side of the other outer circumferential surface 10b are connected to each other.

That is, the cutting blade 10 according to the present embodiment has a shape formed so as to decrease in thickness toward the end portion by connecting two circular truncated cones such that the bottom surfaces of the circular truncated cones are superposed on each other. Hence, an observation of a section obtained by cutting the cutting blade 10 in a radial direction shows that the shape of the end portion of the cutting blade 10 has substantially a V-shape. That is, when the cutting blade 10 is rotated, and the end portion of the cutting blade 10 is made to cut into the wafer 11, a groove 17 including a pair of slopes (inclined side surfaces) and having a V-shape as a sectional shape thereof can be formed in the wafer 11.

Incidentally, a height difference of the end portion of the cutting blade 10 (distance between the edge on one end side of the outer circumferential surface 10b and the edge on the other end side of the outer circumferential surface 10b in a direction along the side surface 10a) is typically larger than the thickness 71 of the device chip 1. Thus, even when only the end portion of the cutting blade 10 is made to cut into the wafer 11, a groove 17 reaching a depth corresponding to the thickness T1 of the device chip 1 can be formed.

A rotation-driving source (not depicted) such as a motor or the like is coupled to the other end side of the spindle 8. A force produced by the rotation-driving source rotates the cutting blade 10 fitted to the one end side of the spindle 8. The cutting unit 6 is, for example, supported by a moving mechanism (not depicted), and is moved in a height direction substantially perpendicular to the holding surface 4a of the chuck table 4 and in a second direction (indexing feed direction) substantially parallel with the holding surface 4a of the chuck table 4 and substantially perpendicular to the first direction.

When a groove 17 is to be formed on the top surface 11a side of the wafer 11, the undersurface 11b of the wafer 11 is first brought into contact with the holding surface 4a of the chuck table 4. Then, the valve is opened to make a negative pressure of the suction source act on the holding surface 4a. Consequently, the undersurface 11b is sucked by the holding surface 4a, and the wafer 11 is held on the chuck table 4 in a state in which the top surface 11a side is exposed upward. Incidentally, a protective member such as an adhesive tape or the like may be affixed to the undersurface 11b of the wafer 11, and the wafer 11 may be held via the protective member.

Next, the orientation of the chuck table 4 is adjusted such that a planned dividing line 13 to be processed and the first direction are parallel with each other. Then, the positions of the chuck table 4 and the cutting unit 6 are adjusted such that the edge on the other end side (edge at a lower end) of the outer circumferential surface 10b of the cutting blade 10 is located above an extension of the planned dividing line 13.

Further, the height of the cutting unit 6 is adjusted such that the height of the lower end of the outer circumferential surface 10b of the cutting blade 10 is lower than the height of the top surface 11a of the wafer 11, and the height of a lower end of the side surface 10a of the cutting blade 10 is higher than the height of the top surface 11a of the wafer 11. More specifically, the height of the cutting unit 6 is adjusted such that the height of the lower end of the outer circumferential surface 10b of the cutting blade 10 is the same as or lower than the height of a part as the undersurface 1b of the device chip 1.

Thereafter, the chuck table 4 is moved in the first direction while the spindle 8 is rotated. It is thereby possible to make only the end portion of the rotating cutting blade 10 cut into the target planned dividing line 13, and consequently form a groove 17 including a pair of slopes on the top surface 11a side of the wafer 11. In the present embodiment, the height of the lower end of the outer circumferential surface 10b of the cutting blade 10 is made to be the same as or lower than the height of a part as the undersurface 1b of the device chip 1. Thus, a distance D1 from the upper surface of the circuit portion 15 to a lower end of the groove 17 is the same as or larger than the thickness T1 of the device chip 1.

In addition, in the present embodiment, the height of the lower end of the side surface 10a of the cutting blade 10 is made higher than the height of the top surface 11a of the wafer 11. Thus, only the end portion of the cutting blade 10 cuts into the wafer 11, but the sice surface 10a does not cut into the wafer 11. Hence, a surface perpendicular to the top surface 11a (and the undersurface 11b) is not formed between the top surface 11a of the wafer 11 and the slope of the groove 17. That is, the slope of the groove 17 is connected to the top surface 11a of the wafer 11.

Further, in the present embodiment, the pair of slopes of the groove 17 is formed in a mode in which the pair of slopes can be visually recognized from the top surface 11a side of the wafer 11. That is, the pair of slopes of the groove 17 is exposed to the top surface 11a side of the wafer 11. Incidentally, the above-described operation is repeated until grooves 17 are formed in all of the planned dividing lines 13 set on the wafer 11.

Figure 3B:
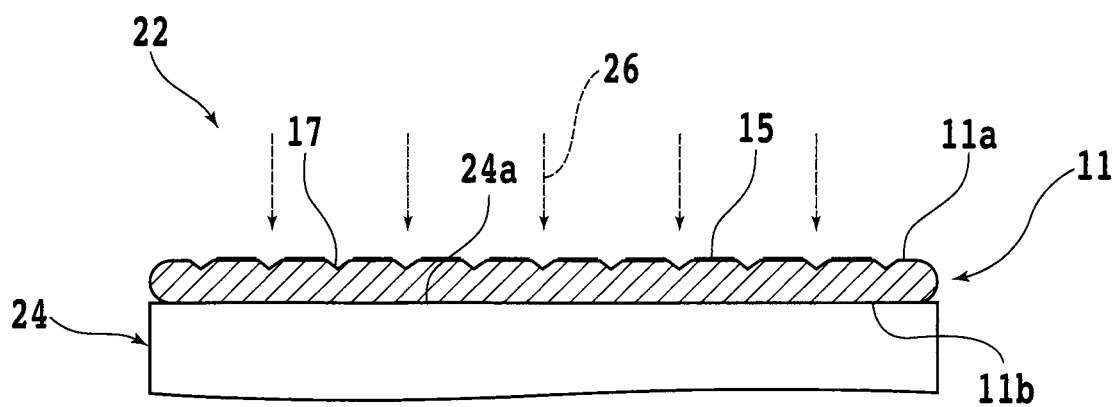
FIG. 3B is a diagram schematically depicting a manner in which the grooves of the wafer are processed from the top surface side by etching (plasma etching)

After the grooves 17 are formed in the wafer 11, the grooves 17 are processed from the top surface 11a side by etching (first etching step). FIG. 3B is a diagram schematically depicting a manner in which the grooves 17 of the wafer 11 are processed from the top surface 11a side by etching (plasma etching).

In the present embodiment, the grooves 17 are processed from the top surface 11a side by using a plasma etching apparatus 22 of FIG. 3B. The plasma etching apparatus 22 includes a vacuum chamber (not depicted) that has a space formed within the vacuum chamber. An electrostatic chuck 24 is disposed in the space within the vacuum chamber. The electrostatic chuck 24 has a plurality of electrodes insulated from each other. The electrostatic chuck 24 sucks the wafer 11 or the like by using an electric force acting between each electrode and the wafer 11.

A flat plate-shaped lower electrode (not depicted) is disposed below the electrostatic chuck 24. In addition, a flat plate-shaped upper electrode (not depicted) is disposed above the electrostatic chuck 24. The upper electrode and the lower electrode are each connected to a high-frequensy power supply disposed on the outside of the vacuum chamber. Incidentally, a plurality of gas jetting holes are formed on the undersurface side of the upper electrode.

When the grooves 17 on the top surface 11a side of the wafer 11 are to be processed by etching, the wafer 11 is first carried into the space within the vacuum chamber and placed on the electrostatic chuck 24. Specifically, the undersurface 11b of the wafer 11 is brought into contact with an upper surface 24a of the electrostatic chuck 24. Then, a potential difference is generated between the electrodes of the electrostatic chuck 24. The wafer 11 is thereby sucked by the electrostatic chuck 24 in a state in which the top surface 11a side of the wafer 11 is exposed upward.

After the wafer 11 is sucked by the electrostatic chuck 24, the space within the vacuum chamber is sealed and decompressed. In this state, when a gas for etching, the gas being typified by carbon tetrafluoride ($CF_4$) or sulfur hexafluoride ($SF_6$), is supplied at a predetermined flow rate through the gas jetting holes, and appropriate high-frequency power is supplied to the lower electrode and the upper electrode, plasma 26 including radicals, ions, and the like occurs on the top surface 11a side of the wafer 11.

As a result, the grooves 17 of the wafer 11 are exposed to the plasma 26, and a stress remaining in the slopes of the grooves 17 is released (stress relief). Hence, the transverse rupture strength (flexural strength, bending strength) of the device chip 1 is increased. Because the slopes of the grooves 17 are inclined with respect to the top surface 11a (not vertical), the slopes of the grooves 17 can be processed easily by etching from the top surface 11a side. In addition, because edges (angles) of connecting portions between the top surface 11a of the wafer 11 and the slopes of the grooves 17 are removed and thus the connecting portions are rounded, the device chip 1 also becomes resistant to impacts.

Incidentally, in the present embodiment, each of the circuit portions 15 is not damaged by the plasma 26 because the wafer 11 is used in which the top surface (the outermost layer or the topmost layer) of the circuit portions 15 excluding the upper ends of the terminals 3a is formed by an insulative protective film (passivation film). Hence, a mask for protecting each of the circuit portions 15 from the plasma 26 does not need to be provided additionally. However, in a case where constituent elements of the circuit portion 15 other than the terminals 15a and the protective film are exposed, the mask for protecting the circuit portions 15 from the plasma 26 needs to be formed.

There is no particular limitation on a method of forming the mask. However, the mask for protecting the circuit portions 15 can be formed when the top surface 11a side of the wafer 11 is coated with a water-soluble resin, for example, and thereafter parts of the resin which parts correspond to the grooves 17 are removed by a laser beam or the like. Needless to say, the mask may be formed by a method such as photolithography or the like.

In addition, a film may be affixed to the top surface 11a side of the wafer 11 before the grooves 17 are formed on the top surface 11a side of the wafer 11. When the wafer 11 is thereafter cut together with the film, for example, the mask can be formed by removing the parts of the film which parts correspond to the grooves 17 while forming the grooves 17 in the wafer 11. Incidentally, in the case where the mask for protecting the circuit portions 15 is formed, the mask is removed after the grooves 17 are processed by etching.

Figure 4A:
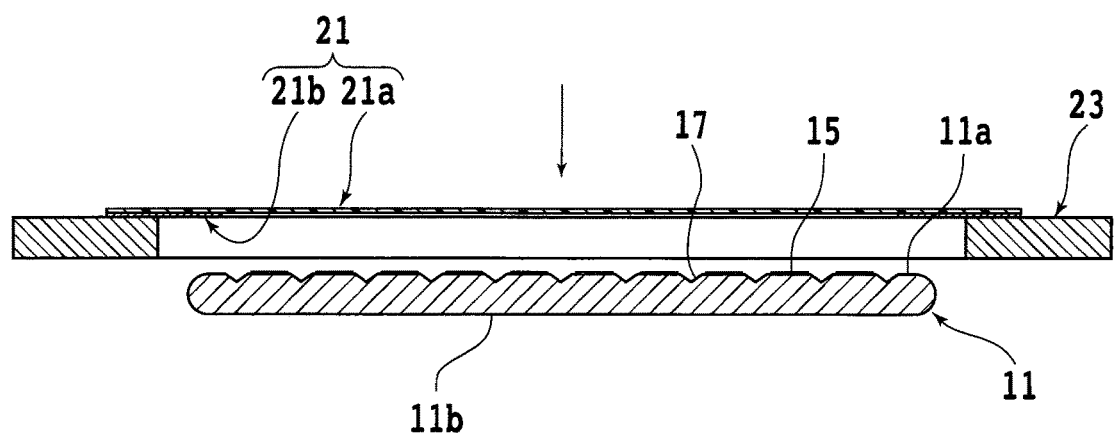
FIG. 4A is a diagram schematically depicting a manner in which a sheet is brought into close contact with the top surface side of the wafer.

A protective member for protecting the top surface 11a side of the wafer 11 is formed after the grooves 17 of the wafer 11 are processed by etching from the top surface 11a side (protective member forming step). Specifically, a sheet is first brought into close contact with the top surface 11a side of the wafer 11 (sheet close contact step). FIG. 4A is a diagram schematically depicting a manner in which the sheet is brought into close contact with the top surface 11a side of the wafer 11.

As depicted in FIG. 4A, the sheet 21 includes a film-shaped base material 21a formed of a resin such as polyolefin (PO), polyvinyl chloride (PVC), polyethylene terephthalate (PET), or the like. The base material 21a is formed in a circular shape having a larger diameter than the wafer 11.

A bonding layer 21b including an adhesive is provided to an outer circumferential portion of one surface of the base material 21a. In the present embodiment, the outer circumferential portion of the sheet 21 is fixed to an annular frame 23 by the adhesive force of the bonding layer 21b. Incidentally, the bonding layer 21b of the sheet 21 is not provided to a part that later comes into contact with a circuit region in which the circuit portions 15 of the wafer 11 are formed. The bonding layer 21b is formed in an annular shape having such a size as to surround the circuit region.

When the sheet 21 is to be brought into close contact with the top surface 11a side of the wafer 11, one surface of the base material 21a constituting the sheet 21 is faced to the top surface 11a of the wafer 11 in a sufficiently decompressed environment, for example. Then, the sheet 21 is pressed against the wafer 11 such that an outer circumferential region on the outside of the circuit region of the wafer 11 and the bonding layer 21b come into contact with each other.

The pressure (atmospheric pressure) of the environment is increased after the sheet 21 is pressed against the wafer 11. As a result, the sheet 21 comes into close contact with the top surface 11a side of the wafer 11 due to the pressure of the environment. Incidentally, the sheet 21 is preferably heated when the sheet 21 is pressed against the wafer 11 and when the pressure of the environment is increased. The sheet 21 is thereby deformed easily so as to follow projections and depressions present on the zop surface 11a side of the wafer 11, so that adhesion between the wafer 11 and the sheet 21 is improved.

Incidentally, the sheet 21 is bonded to the outer circumferential region of the wafer 11 by the bonding layer 21b, but is not bonded to the circuit region of the wafer 11. The sheet 21 is only in close contact with the circuit region of the wafer 11. Thus, the adhesive of the bonding layer 21b does not remain on the circuit region when the sheet 21 is peeled off from the wafer 11, for example. Further, the bonding layer 21b may be provided to only a part to which the annular frame 23 is fixed. That is, the sheet 21 does not have to be bonded to the outer circumferential region of the wafer 11 by the bonding layer 21b.

Figure 4B:
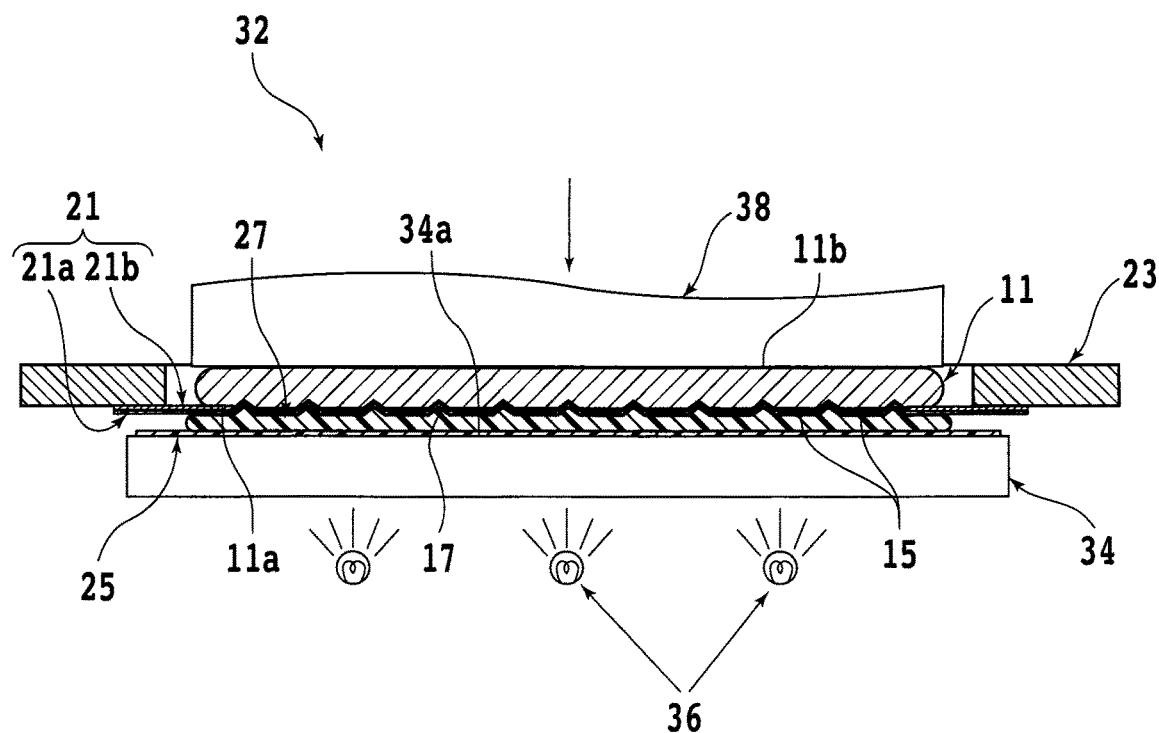
FIG. 4E is a diagram schematically depicting a manner in which a resin plate covering the sheet is formed.

After the sheet 21 is brought into close contact with the top surface 11a side of the wafer 11, a resin plate covering the sheet 21 is formed (resin plate forming step). FIG. 4B is a diagram schematically depicting a manner in which the resin plate covering the sheet 21 is formed. In the present embodiment, a resin plate forming apparatus 32 in FIG. 4B is used to form the resin plate covering the sheet 21.

The resin plate forming apparatus 32, for example, includes a supporting plate 34 formed of a material transmitting ultraviolet rays. An upper surface 34a of the supporting plate 34 is substantially flat. In addition, ultraviolet light sources 36 are arranged below the supporting plate 34, and a press unit 38 for applying a downward pressure to the wafer 11 is disposed above the supporting plate 34.

When the resin plate covering the sheet 21 is to be formed, a flat sheet 25 forned of a resin such as PO, PVC, PET, or the like is placed on the upper surface 34a of the supporting plate 34. In addition, the upper surface of the sheet 25 is coated with a liquid resin 27 that is cured by ultraviolet rays.

Next, another surface of the base material 21a constituting the sheet 21 is brought into contact with the resin 27, and the press unit 38 applies a downward pressure to the undersurface 11b of the wafer 11 exposed upward. Consequently, the liquid resin 27 spreads in a radial direction of the wafer 11, and a region of the sheet 21 which region corresponds to the wafer 11 is covered by the liquid resin 27. That is, projections and depressions on the top surface 11a side which projections and depressions result from the grooves 17 and the like are buried by the liquid resin 27.

The liquid resin 27 is thereafter cured by irradiating the liquid resin 27 with ultraviolet rays by the ultraviolet light source 36. Consequently, as depicted in FIG. 4B, a resin plate 29 (see FIG. 5A) covering the region of the sheet 21 which region corresponds to the wafer 11 is formed. Incidentally, the press unit 38 does not necessarily need to apply pressure to the wafer 11 when the liquid resin 27 is irradiated with ultraviolet rays.

Figure 5A:
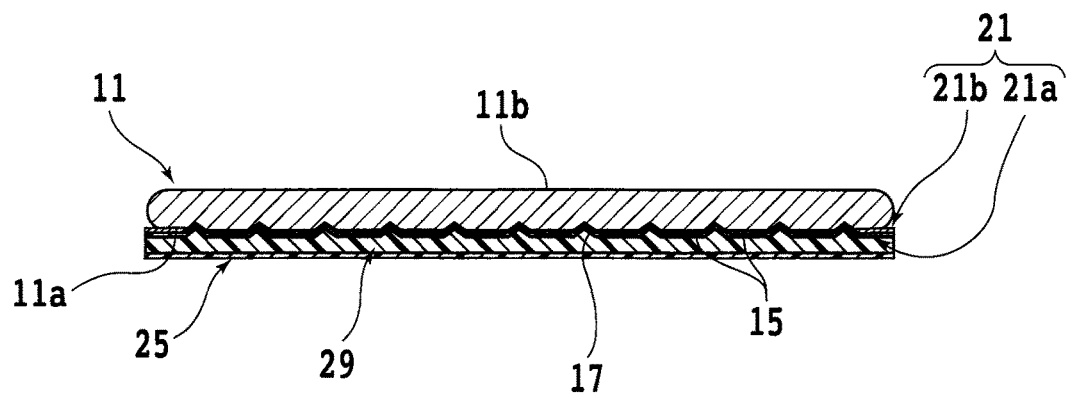
FIG. 5A is a diagram schematically depicting a state in which a protective member is completed.

After the resin plate 29 covering the sheet 21 is formed, the resin plate 29 is cut along the outer peripheral edge of the wafer 11 together with the sheet 21, the sheet 25, and the like (cutting step). A circular protective member including the sheet 21, the sheet 25, and the resin plate 29 is thereby completed. FIG. 5A is a diagram schematically depicting a state in which the protective member is completed.

Figure 5B:
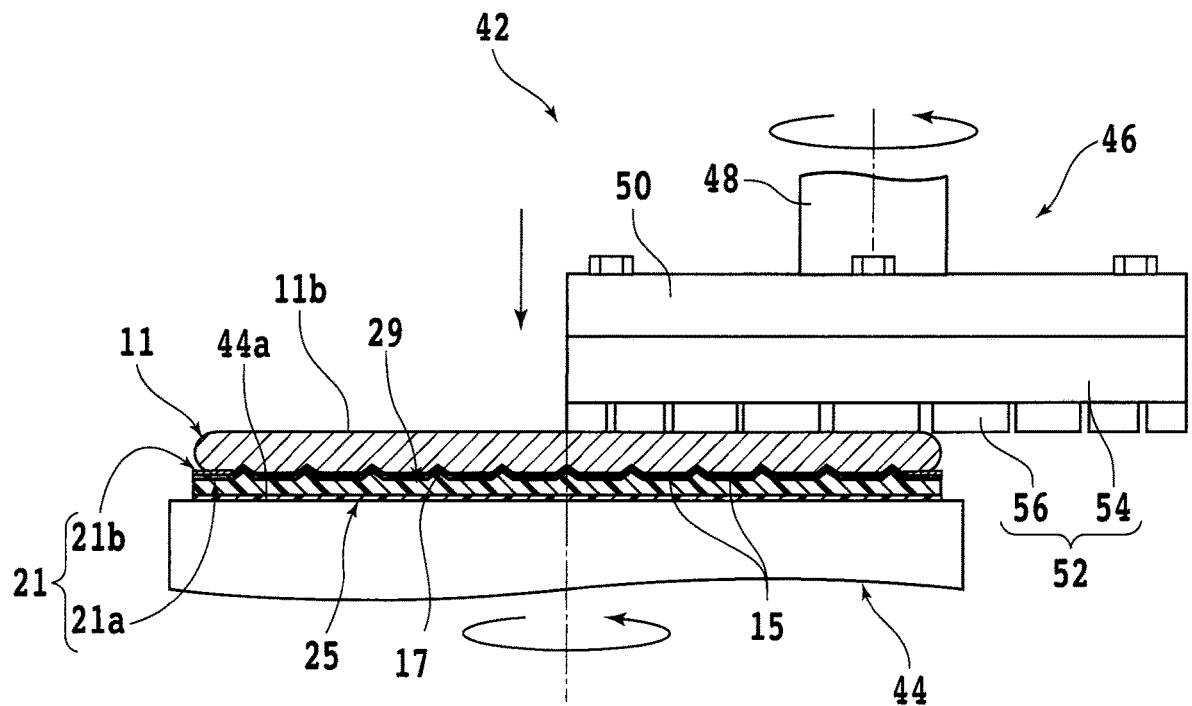
FIG. 5B is a diagram schematically depicting a manner in which the undersurface side of the wafer is ground.

After the protective member is completed, the wafer 11 is thinned by grinding the undersurface 11b of the wafer 11 (grinding step). FIG. 5B is a diagram schematically depicting a manner in which the undersurface 11b side of the wafer 11 is ground. In the present embodiment, the undsrsurface 11b side of the wafer 11 is ground by using a grinding apparatus 42 in FIG. 5B.

The grinding apparatus 42 includes a chuck table 44 used at time of holding the wafer 11. The chuck table 44, for example, includes a cylindrical frame body formed of a metallic material typified by a stainless steel and a holding plate formed of a porous material and disposed on an upper portion of the frame body. The upper surface of the holding plate constitutes a holding surface 44a holding the wafer 11.

The lower surface side of the holding plate is connected to a suction source (not depicted) via a flow passage provided within the frame body or the like. The flow passage or the like is provided with a valve (not depicted) that controls a flow of fluid. Therefore, when the valve is opened, the wafer 11 can be sucked by making a negative pressure of the suction source act on the holding surface 44a.

The frame body of the chuck table 44 is coupled to a rotation-driving source (not depicted) such as a motor or the like. A force produced by the rotation-driving source rotates the frame body of the chuck table 44 about a rotational axis substantially perpendicular to the above-described holding surface 44a. In addition, the frame body of the chuck table 44 is supported by a moving mechanism (not depicted), and is moved in a direction substantially parallel with the above-described holding surface 44a.

A grinding unit 46 is disposed above the chuck table 44. The grinding unit 46 includes a tubular spindle housing (not depicted). Housed in a space inside the spindle housing is a spindle 48 as a rotational axis substantially perpendicular to the holding surface 44a of the chuck table 44.

A disk-shaped mount 50 is fixed to a lower end portion of the spindle 48. A disk-shaped grinding wheel 52 substantially equal in diameter to the mount 50 is fitted to a lower surface of the mount 50. The grinding wheel 52 includes a wheel base 54 formed of a metallic material such as a stainless steel, aluminum, or the like. A plurality of grinding stones 56 are arranged annularly on a lower surface of the wheel base 54.

A rotation-driving source (not depicted) such as a motor or the like is coupled to an upper end side of the spindle 48. A force produced by the rotation-driving source rotates the grinding wheel 52. A nozzle (not depicted) for supplying a liquid for grinding (typically water) to the wafer 11 or the like is provided at a position adjacent to the grinding wheel 52 or within the grinding wheel 52. The grinding unit 46 is, for example, supported by a moving mechanism (not depicted), and is moved in a direction substantially perpendicular to the holding surface 44a of the chuck table 44.

When the undersurface 11b of the wafer 11 is to be ground, the sheet 25 of the protective member formed on the top surface 11a side of the wafer 11 is first brought into contact with the holding surface 44a of the chuck table 44. Then, the valve is opened to make a negative pressure of the suction source act on the holding surface 44a. The sheet 25 is thereby sucked by the holding surface 44a. That is, the wafer 11 is held on the chuck table 44 via the protective member in a state in which the undersurface 11b side is exposed upward.

Next, the chuck table 44 is moved to a position below the grinding unit 46. Thereafter, as depicted in FIG. 5B, the chuck table 44 and the spindle 48 (grinding wheel 52) are each rotated, and the grinding unit 46 (grinding wheel 52) is lowered while the liquid for grinding is supplied to the undersurface 11b side of the wafer 11. A speed at which the grinding unit 46 is lowered is adjusted in a range in which the grinding stones 56 are appropriately pressed against the undersurface 11b of the wafer 11.

Thus, the wafer 11 can be thinned by grinding the undersurface 11b side of the wafer 11. In the present embodiment, the wafer 11 is thinned until at least the slopes of the grooves 17 are connected to the undersurface 11b, and the wafer 11 is divided into a plurality of device chips 1 and an edge material 31 (see FIG. 6) with the grooves 17 (planned dividing lines 13) as boundaries.

Incidentally, the top surface 11a of the wafer 11 becomes the top surface 1a of the device chip 1, the undersurface 11b of the wafer 11 after the grinding becomes the undersurface 1b of the device chip 1, and the slopes of the grooves 17 become the slopes 1c of the device chip 1. In the present embodiment, a flat protective member is formed by burying the projections and depressions on the top surface 11a side which projections and depressions result from the grooves 17 or the like by the liquid resin 27. Thus, the undersurface 11b can be ground and flattened without being affected by the projections and depressions on the top surface 11a side.

Figure 6A:
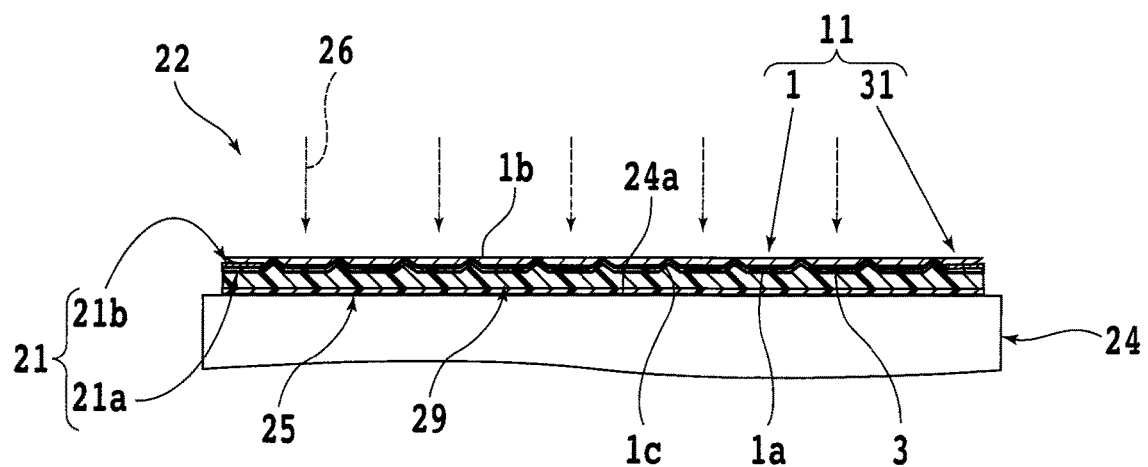
FIG. 6A is a diagram schematically depicting a manner in which the undersurface side of the wafer is processed by etching (plasma etching)

After the undersurface 11b of the wafer 11 is ground, the undersurface 11b of the wafer 11 (undersurface 1b of the device chip 1) is processed by etching (second etching step). FIG. 6A is a diagram schematically depicting a manner in which the undersurface 11b of the wafer 11 is processed by etching (plasma etching).

In the present embodiment, the undersurface 11b of the wafer 11 is processed by using the plasma etching apparatus 22 described above. First, the wafer 11 is carried into the space within the vacuum chamber, and placed on the electrostatic chuck 24. Specifically, the sheet 25 of the protective member formed on the top surface 11a side of the wafer 11 is brought into contact with the upper surface 24a of the electrostatic chuck 24.

Then, a potential difference is generated between the electrodes of the electrostatic chuck 24. The wafer 11 and the protective member formed on the top surface 11a side of the wafer 11 is thereby sucked by the electrostatic chuck 24. That is, the wafer 11 is held on the electrostatic chuck 24 via the protective member in a state in which the undersurface 11b side is exposed upward.

After the wafer 11 is held on the electrostatic chuck 24, the space within the vacuum chamber is sealed and decompressed. In this state, when a gas for etching, the gas being typified by $CF_4$ or $SF_6$, is supplied at a predetermined flow rate through the gas jetting holes, and appropriate high-frequency power is supplied to the lower electrode and the upper electrode, plasma 26 including radicals, ions, and the like occurs on the undersurface 11b side of the wafer 11.

As a result, the undersurface 11b of the wafer 11 is exposed to the plasma 26, and a stress remaining in the undersurface 11b is released (stress relief). Hence, the transverse rupture strength of the device chip 1 is increased. In addition, because edges of connecting portions between the undersurface 1b of the device chip 1 (the undersurface 11b of the wafer 11) and the slopes 1c (the slopes of the grooves 17) are removed, and thus the connecting portions are rounded, the device chip 1 also becomes resistant to impacts.

Figure 6B:
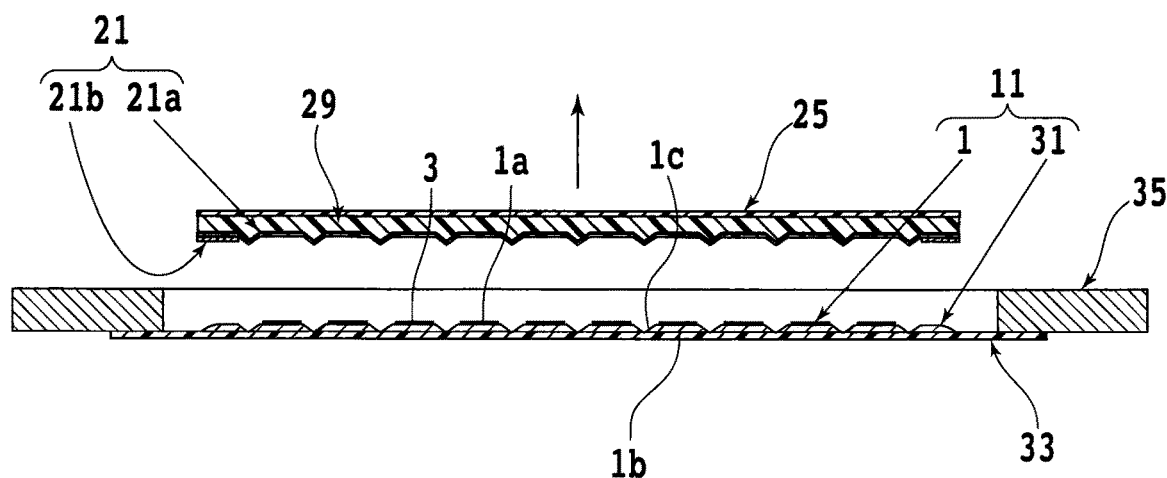
FIG. 6B is a diagram schematically depicting a manner in which the protective member is removed from the wafer.

After the undersurface 11b of the wafer 11 is processed by etching, the protective member is removed from the wafer 11 (protective member removing step). FIG. 6B is a diagram schematically depicting a manner in which the protective member is removed from the wafer 11. Specifically, for example, the undersurface 11b side of the wafer 11 is affixed to a circular adhesive tape 33, and then the protective member is peeled off from the wafer 11. Incidentally, an annular frame 35 surrounding the wafer 11 is preferably fixed to the outer circumferential portion of the adhesive tape 33.

As described above, the sheet 21 of the protective member is bonded only to the outer circumferential region of the wafer 11 by the bonding layer 21b. Therefore, the protective member can be peeled off and easily removed from the wafer 11. In addition, the adhesive included in the bonding layer 21b of the sheet 21 does not remain on the top surface 1a side (circuit portion 3) of the device chip 1.

Thus, in the method of manufacturing the device chip according to the present embodiment, the grooves 17 including slopes are formed on the wafer 11 by cutting the planned dividing lines 13 of the wafer 11 from the top surface 11a side by the end portion of the cutting blade 10 having the inclined outer circumferential surfaces 10b at the end portion thereof, and thereafter the wafer 11 is divided such that the slopes of the grooves 17 are connected to the undersurface 11b. Therefore, the device chip 1 having the slopes 1c inclined with respect to the top surface 1a and the undersurface 1b and exposed on the top surface 1a side can be obtained reliably.

Figure 7:
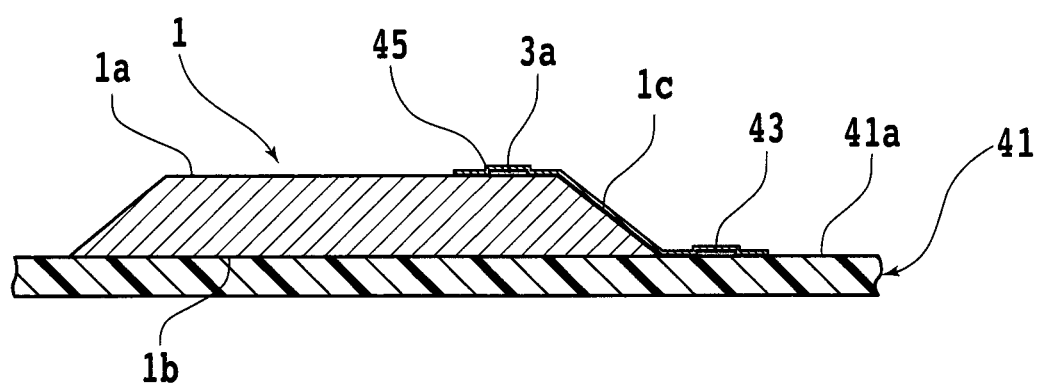
FIG. 7 is a sectional view schematically depicting a state in which the device chip is mounted on a flexible board.

FIG. 7 is a sectional view schematically depicting a state in which the device chip 1 is mounted on a flexible board. Incidentally, in FIG. 7, constituent elements of a part of the device chip 1 are omitted for the convenience of description. As depicted in FIG. 7, when the device chip 1 is to be mounted on the flexible board 41, the device chip 1 is first disposed on an upper surface 41a of the flexible board 41.

Specifically, for example, the undersurface 1b side of the device chip 1 is bonded to the upper surface 41a of the flexible board 41 by an adhesive or the like so as not to overlap a terminal 43 disposed on the upper surface 41a of the flexible board 41. The top surface 1a and the slope 1c of the device chip 1 are thereby exposed upward.

Thereafter, wiring 45 electrically connecting a terminal 3a of the device chip 1 and the terminal 43 on the flexible board 41 to each other is formed on the wiring portion 5 including the slope 1c by a method such as printing or the like. Incidentally, there is no particular limitation on a concrete method of forming the wiring 45. However, a method such as screen printing, ink jet printing, or the like is preferably used.

Thus, when the device chip 1 is disposed on the flexible board 41 such that the top surface 1a and the slope 1c are exposed, almost no level difference occurs between the circuit portion 3 on the top surface 1a side and the slope 1c and between the slope 1c and the flexible board 41. Hence, the terminal 3a of the circuit portion 3 and the terminal 43 on the flexible board 41 can be reliably connected to each other by merely forming wiring on the wiring portion 5 including the slope 1c by a method such as printing or the like.

It is to be noted that the present invention is not limited to the description of the foregoing embodiment, but can be modified and carried out variously. For example, while the device chip 1 is mounted on the flexible board 41 in the foregoing embodiment, the device chip according to the present invention can be mounted on an arbitrary board.

In addition, in the foregoing embodiment, plasma etching (dry etching) is employed as etching for processing the grooves 17 and the undersurface 11b of the wafer 11. However, the grooves 17 and the undersurface 11b can also be processed by wet etching.

In addition, in the foregoing embodiment, the protective member is formed by using the sheet 21 in which the bonding layer 21b is not provided to the part that comes into contact with the circuit region of the wafer 11. However, the protective member can also be formed by using an ordinary protective tape having a bonding layer provided to the entire surface of the protective tape. Needless to say, the protective member may be constituted by only the ordinary protective tape.

In addition, in the foregoing embodiment, the wafer 11 is thinned until the wafer 11 is divided into a plurality of device chips 1 and an edge material 31 with the grooves 17 (planned dividing lines 13) as boundaries by grinding the undersurface 11b side of the wafer 11. However, after the undersurface 11b side of the wafer 11 is ground, the wafer 11 may be divided into the plurality of device chips 1 and the edge material 31 by another method.

For example, after the undersurface 11b of the wafer 11 is ground, the undarsurface 11b of the wafer 11 is processed by etching, and thereby the wafer 11 can be further thinned and divided into the plurality of device chips 1 and the edge material 31 (dividing step). That is, in this case, the slopes of the grooves 17 and the undersurface 11b are connected to each other by processing the undersurface 11b of the wafer 11 by etching. Incidentally, after the wafer 11 is divided into the plurality of device chips 1 and the edge material 31, it suffices to remove the protective member from the wafer 11 (protective member removing step).

In addition, the wafer 11 can also be further thinned and divided into the plurality of device chips 1 and the edge material 31 by polishing the undersurface 11b of the wafer 11 (dividing step). Incidentally, after the wafer 11 is divided into the plurality of device chips 1 and the edge material 31, the protective member may be removed (protective member removing step) after the undersurface 11b of the wafer 11 is processed by etching (second etching step), or the protective member may be removed without the undersurface 11b of the wafer 11 being processed by etching.

In addition, in the foregoing embodiment, a substantially flat slope 1c has been illustrated. However, the slope as a side wall of the device chip may also be formed in the shape of a curved surface. When a slope in the shape of a curved surface is formed, a cutting blade having an outer circumferential surface conforming to the shape of the slope is used, for example. After a substantially flat slope is formed, the slope may be processed into the shape of a curved surface by etching or the like.

Figure 8A:
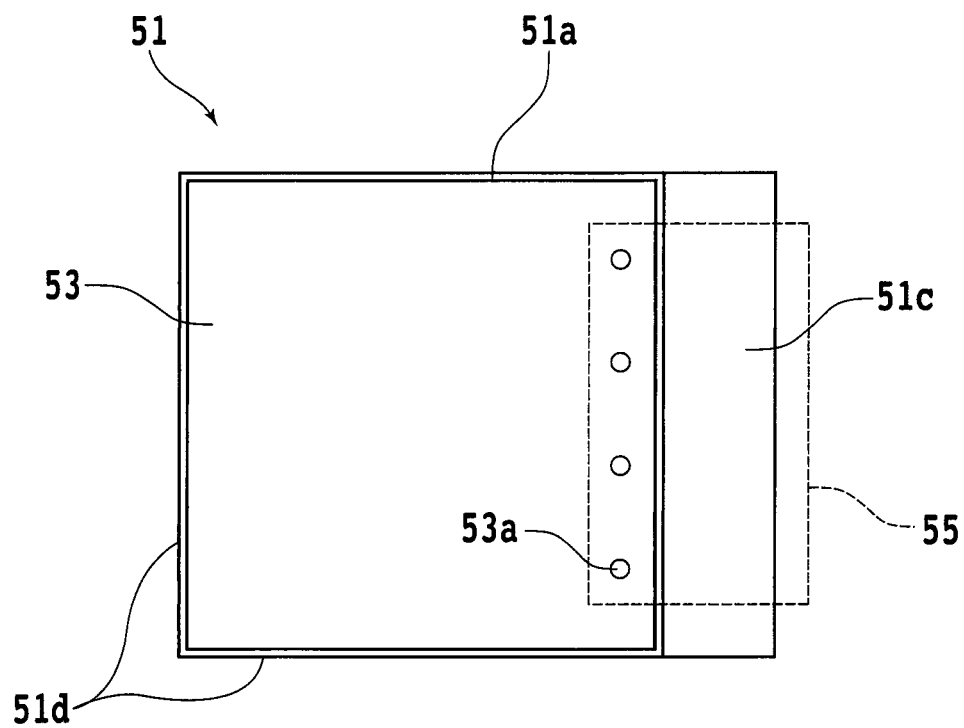
FIG. 8A is a plan view of a device chip according to a first modification.
Figure 8B:
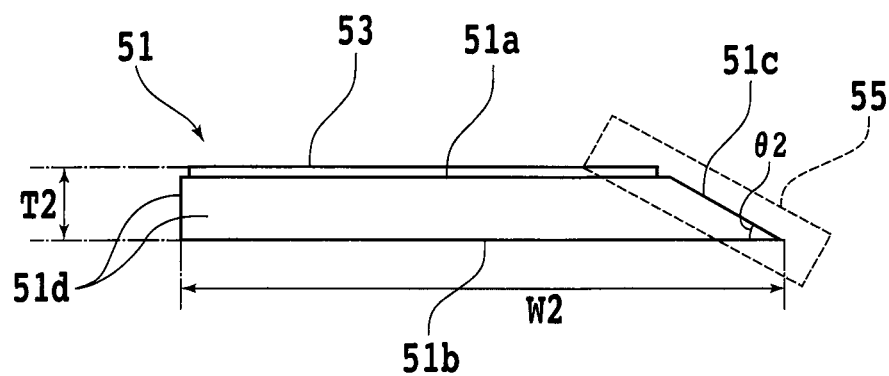
FIG. 8B is a side view of the device chip according to the first modification.

In addition, in the foregoing embodiment, the device chip 1 in the shape of a truncated quadrangular pyramid including four slopes 1c as side walls has been illustrated. However, it suffices for the device chip according to the present invention to include at least one slope. FIG. 8A is a plan view of a device chip according to a first modification. FIG. 8B is a side view of the device chip according to the first modification.

As depicted in FIG. 8A and FIG. 8B, a basic structure of the device chip 51 according to the first modification is the same as the structure of the device chip 1 according to the foregoing embodiment. Specifically, the device chip 51 includes a top surface 51a and an undersurface 51b located on an opposite side from the top surface 51a.

The top surface 51a and the undersurface 51b are each formed in substantially a flat rectangular shape. In addition, the top surface 51a and the undersurface 51b are arranged substantially in parallel with each other. The area of the undersurface 51b is larger than the area of the top surface 51a. That is, the area of the top surface 51a is smaller than the area of the undersurface 51b.

A part of an edge of the undersurface 51b, the edge corresponding to one of four sides of the rectangle, is disposed on the side of a part of an edge of the top surface 51a, the edge corresponding to one of four sides of the rectangle. The part of the edge of the top surface 51a and the part of the edge of the undersurface 51b are parallel with each other. The part of the edge of the top surface 51a and the part of the edge of the undersurface 51b are connected to each other by a slope 51c inclined with respect to the top surface 51a and the undersurface 51b.

That is, a part of an edge of the slope 51c inclined with respect to the top surface 51a and the undersurface 51b is connected to the part of the edge of the top surface 51a, the edge corresponding to one side of the rectangle. In addition, another part of an edge of the slope 51c inclined with respect to the top surface 51a and the undersurface 51b is connected to the part of the edge of the undersurfaca 51b, the edge corresponding to one side of the rectangle. The slope 51c is formed so as to be substantially flat, and is exposed only to the top surface 51a side.

Respective parts of edges of the undersurface 51b, the edges corresponding to other three sides of the rectangle, are also arranged on the sides of respective parts of edges of the top surface 51a, the edges corresponding to other three sides of the rectangle. The respective parts of the edges of the top surface 51a are parallel with the respective parts of the edges of the undersurface 51b. However, the respective parts of the edges of the top surface 51a are connected to the respective parts of the edges of the undersurface 51b by side surfaces 51d substantially perpendicular to the top surface 51a and the undersurface 51b. That is, the device chip 51 according to the first modification has a rectangular shape as viewed from the top surface 51a side or the undersurface 51b side, and includes one slope 51c and three side surfaces 51d as side walls.

A circuit portion (device) 53 including an electronic circuit is provided to the top surface 51a side of the device chip 51. The circuit portion 53 includes a plurality of terminals 53a exposed to the outside. The plurality of terminals 53a are arranged along an edge of the top surface 51a which edge is connected to the slope 51c. When the device chip 51 is mounted on a flexible board, the terminals 53a of the circuit portion 53 are electrically connected to terminals on the flexible board by wiring.

Together with a region corresponding to the terminals 53a of the circuit portion 53, a part of the slope 51c constitutes a wiring portion 55 on which wiring is formed when the device chip 51 is mounted on the flexible board. As described above, the device chip 51 according to the first modification has a rectangular shape as viewed from the top surface 51a side or the undersurface 51b side, and the wiring portion 55 is disposed only in a region corresponding to one side of the rectangle (side corresponding to the slope 51c).

There is no particular limitation on an angle θ2 formed between the undersurface 51b and the slope 51c of the device chip 51, the width W2 of the device chip 51, the thickness (finished thickness) T2 of the device chip 51, and the like. For example, the angle θ2, the width W2, and the thickness T2 can be made nearly equal to the angle θ1, the width W1, and the thickness 71 of the device chip 1.

Figure 9:
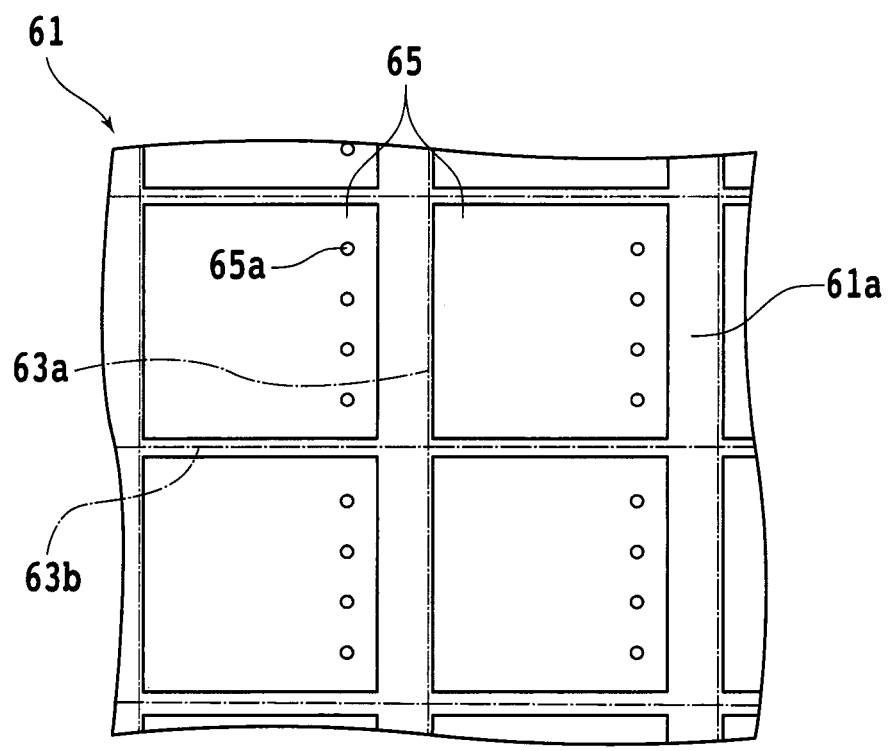
FIG. 9 is a plan view in which a part of the top surface side of a wafer used for manufacturing the device chip according to the first modification is enlarged.

FIG. 9 is a plan view in which a part of the top surface side of a wafer used for manufacturing the device chip 51 is enlarged. As depicted in FIG. 9, a basic structure of a wafer 61 used for manufacturing the device chip 51 is the same as the structure of the wafer 11 according to the foregoing embodiment. Specifically, the wafer 61 includes a top surface 61a and an undersurface 61b (see FIG. 10) located on an opposite side from the top surface 61a.

The top surface 61a side of the wafer 61 is demarcated into a plurality of small regions by first planned dividing lines (first streets) 63a and second planned dividing lines (second streets) 63b intersecting each other. A circuit portion (device) 65 including an electronic circuit is formed in each small region. An outermost layer (topmost layer) of each circuit portion 65 is typically formed by an insulative protective film (passivation film). In addition, as depicted in FIG. 9, each circuit portion 65 includes a plurality of terminals 65a exposed to the outside.

Incidentally, in the wafer 61, an interval between two circuit portions 65 arranged with the first planned dividing line 63a interposed therebetween is wider than an interval between two circuit portions 65 arranged with the second planned dividing line 63b interposed therebetween. In addition, the first planned dividing line 63a is disposed at a position close to one of the two adjacent circuit portions 65 and distant from the other.

Figure 10:
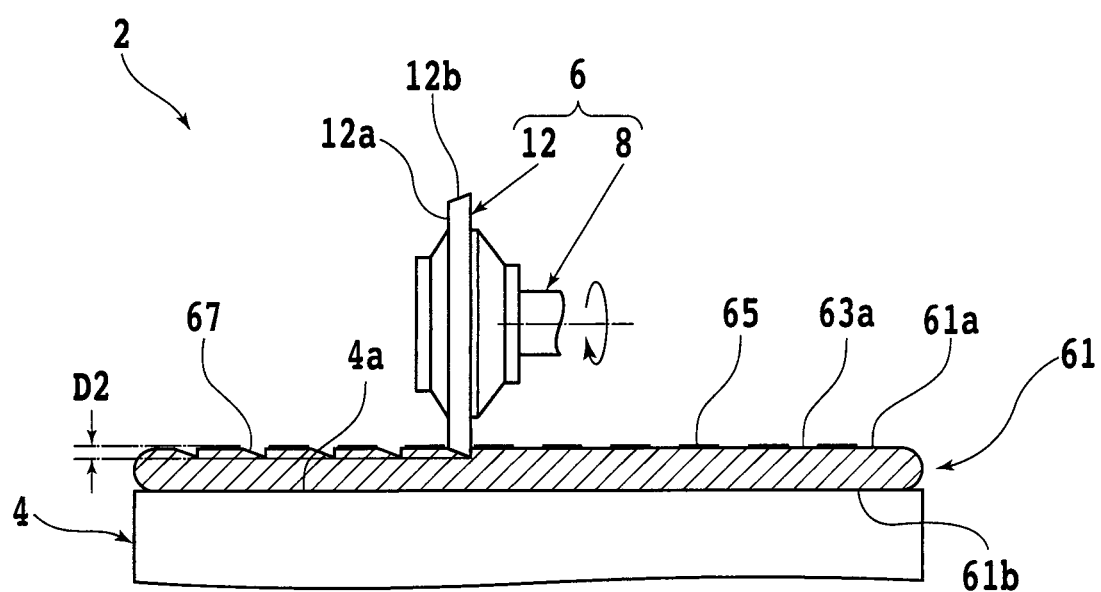
FIG. 10 is a diagram schematically depicting a manner in which grooves are formed in the wafer used for manufacturing the device chip according to the first modification.

FIG. 10 is a diagram schematically depicting a manner in which grooves are formed in the wafer 61 used for manufacturing the device chip 51. The above-described cutting apparatus 2 is used when forming grooves 67 including slopes in the first planned dividing lines 63a of the wafer 61. In this case, however, a cutting blade 12 is used in place of the cutting blade 10 used to form the grooves 17.

The cutting blade 12, for example, includes a pair of side surfaces 12a that are substantially flat and parallel with each other. The cutting blade 12 is fitted to one end side of the spindle 8 such that the pair of side surfaces 12a is perpendicular to the rotational axis. That is, the pair of side surfaces 12a of the cutting blade 12 is substantially perpendicular to the holding surface 4a of the chuck table 4, and is substantially parallel with the first direction.

In addition, an outer circumferential surface 12b inclined with respect to the pair of side surfaces 12a is provided to an end portion corresponding to the outer peripheral edge of the cutting blade 12. The outer circumferential surface 12b is formed in the shape of a curved surface corresponding to the side surface of a circular truncated cone (a part of a circular conical surface). An edge on one end side of the outer circumferential surface 12b is connected with an edge of one side surface 12a. In addition, an edge on another end side of the outer circumferential surface 12b is connected with an edge of the other side surface 12a. That is, the cutting blade 12 has a shape corresponding to a circular truncated cone.

A height difference of the end portion of the cutting blade 12 (distance between the edge on one end side of the outer circumferential surface 12b and the edge on the other end side of the outer circumferential surface 12b in a direction along the side surfaces 12a) is typically larger than the thickness T2 of the device chip 51. Thus, when only the end portion of the cutting blade 12 is made to cut into the wafer 61, a groove 67 reaching a depth corresponding to the thickness T2 of the device chip 51 can be formed.

A procedure at a time of forming the grooves 67 in the first planned dividing lines 63a of the wafer 61 is similar to the procedure at the time of forming the grooves 17 in the wafer 11 in the foregoing embodiment. However, in this case, the positions of the chuck table 4 and the cutting unit 6 are adjusted such that the edge (edge at a lower end) of one side surface 12a of the cutting blade 12 is located above an extension of the first planned dividing line 63a.

In addition, the height of the cutting unit 6 is adjusted such that the height of the lower end of one side surface 12a of the cutting blade 12 is the same as or lower than the height of a part as the undersurface 51b of the device chip 51, and the height of the lower end of the other side surface 12a of the cutting blade 12 is higher than the height of the top surface 61a of the wafer 61.

Thus, a distance D2 from the upper surface of a circuit portion 65 to the lower end of a groove 67 is the same as or larger than the thickness T2 of the device chip 51. Incidentally, it suffices to use a cutting blade of an arbitrary shape when forming grooves in the second planned dividing lines 63b. For example, a cutting blade having an outer circumferential surface substantially perpendicularly intersecting side surfaces can be used.

Figure 11:
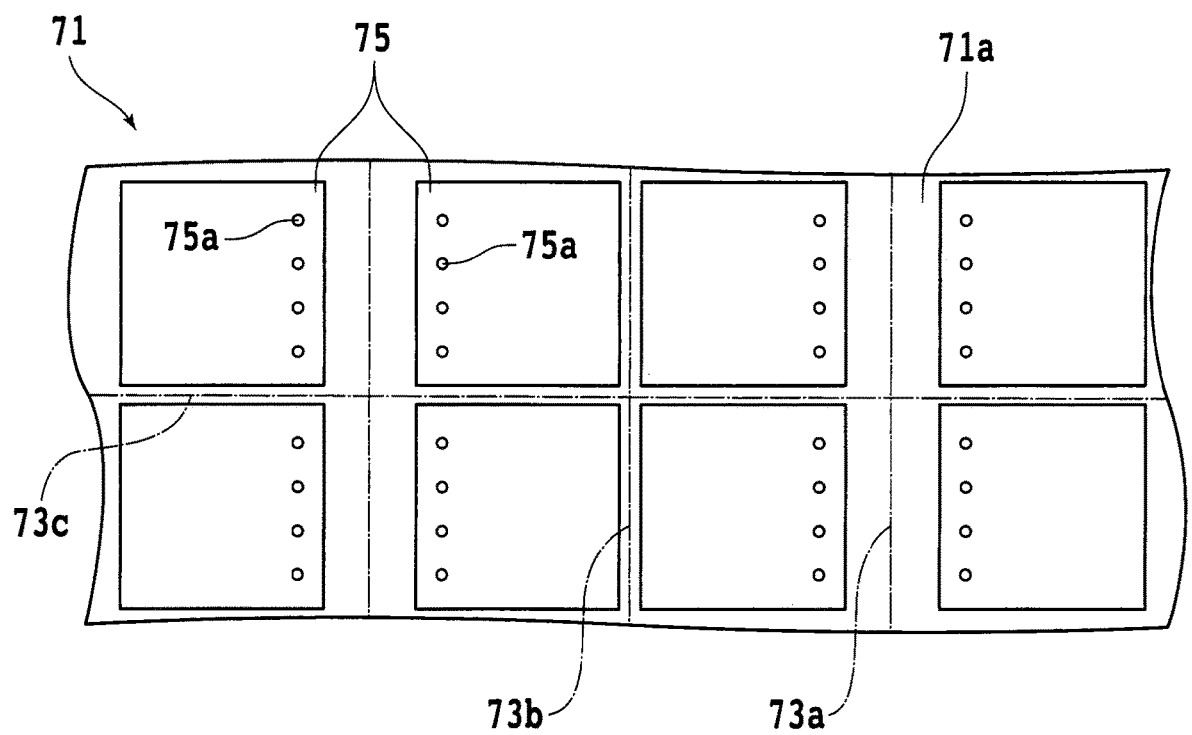
FIG. 11 is a plan view in which a part of the top surface side of another wafer used for manufacturing the device chip according to the first modification is enlarged.

FIG. 11 is a plan view in which a part of the top surface side of another wafer used for manufacturing the device chip 51 is enlarged. As depicted in FIG. 11, a basic structure of a wafer 71 used for manufacturing the device chip 51 is the same as the structure of the wafer 11 according to the foregoing embodiment. Specifically, the wafer 71 includes a top surface 71a and an undersurface 71b (see FIG. 12) located on an opposite side from the top surface 71a.

The top surface 71a side of the wafer 71 is demarcated into a plurality of small regions by first planned dividing lines (first streets) 73a and second planned dividing lines (second streets) 73b parallel with each other and third planned dividing lines (third streets) 73c intersecting the first planned dividing lines 73a and the second planned dividing lines 73b. A circuit portion (device) 75 including an electronic circuit is formed in each small region. An outermost layer (topmost layer) of each circuit portion 75 is typically formed by an insulative protective film (passivation film).

In addition, as depicted in FIG. 11, each circuit portion 75 includes a plurality of terminals 75a exposed to the outside. Incidentally, in the wafer 71, an interval between two circuit portions 75 arranged with the first planned dividing line 73a interposed therebetween is wider than an interval between two circuit portions 75 arranged with the second planned dividing line 73b interposed therebetween. In addition, an interval between two circuit portions 75 arranged with the second planned dividing line 73b interposed therebetween is nearly equal to an interval between two circuit portions 75 arranged with the third planned dividing line 73c interposed therebetween.

Figure 12:
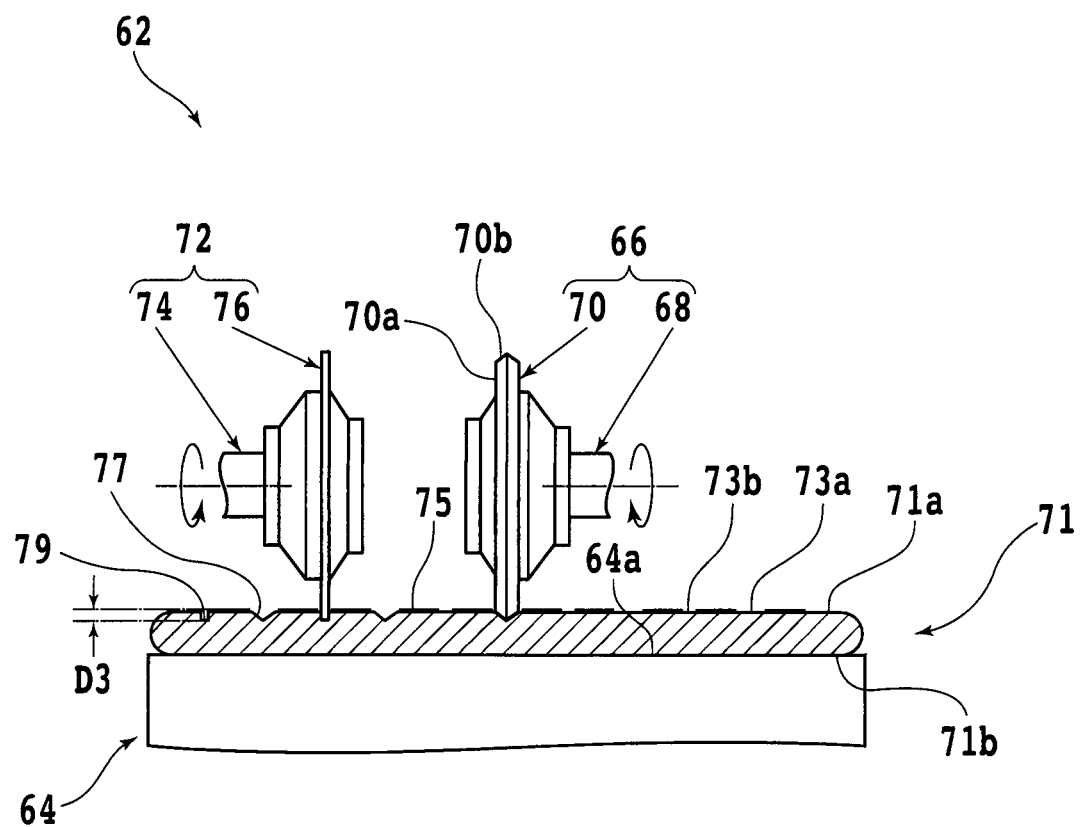
FIG. 12 is a diagram schematically depicting a manner in which grooves are formed in the another wafer used for manufacturing the device chip according to the first modification.

FIG. 12 is a diagram schematically depicting a manner in which grooves are formed in the wafer 71 used for manufacturing the device chip 51. A cutting apparatus 62 depicted in FIG. 12 is used at a time of forming grooves 77 in the first planned dividing lines 73a of the wafer 71 and forming grooves 79 in the second planned dividing lines 73b of the wafer 71. A basic structure of the cutting apparatus 62 is the same as that of the cutting apparatus 2.

Specifically, the cutting apparatus 62 includes a chuck table 64 used at a time of holding the wafer 71. The chuck table 64, for example, includes a cylindrical frame body formed of a metallic material typified by a stainless steel and a holding plate formed of a porous material and disposed on an upper portion of the frame body. The upper surface of the holding plate constitutes a holding surface 64a holding the wafer 71.

A first cutting unit 66 is disposed above the chuck table 64. The first cutting unit 66 includes a tubular spindle housing (not depicted). A spindle 68 is housed in a space inside the spindle housing. An annular cutting blade (first cutting blade) 70 formed by fixing abrasive grains such as diamond or the like by a bonding material such as a resin, a metal, or the like is fitted to one end side of the spindle 68.

The cutting blade 70 has the same structure as the structure of the above-described cutting blade 10. Specifically, the cutting blade 70 includes a pair of side surfaces 70a that are substantially flat and parallel with each other. A pair of outer circumferential surfaces 70b inclined with respect to the pair of side surfaces 70a is provided to an end portion corresponding to the outer peripheral edge of the cutting blade 70.

In addition, a second cutting unit 72 is disposed above the chuck table 64. The second cutting unit 72 also includes a tubular spindle housing (not depicted). A spindle 74 is housed in a space inside the spindle housing. An annular cutting blade (second cutting blade) 76 formed by fixing abrasive grains such as diamond or the like by a bonding material such as a resin, a metal, or the like is fitted to one end side of the spindle 74. There is no particular limitation on the shape of the cutting blade 76. However, used in this case is a cutting blade having an outer circumforential surface substantially perpendicularly intersecting side surfaces and having a smaller width (interval between the side surfaces) than the end portion (pair of outer circumferential surfaces 70b) of the cutting blade 70.

The first cutting unit 66 to which the cutting blade 70 is fitted is used at a time of forming grooves 77 including slopes in the first planned dividing lines 73a of the wafer 71. A concrete procedure is similar to the procedure at a time of forming the grooves 17 in the wafer 11 in the foregoing embodiment. Incidentally, the height of the first cutting unit 66 is adjusted such that a distance D3 from the upper surface of a circuit portion 75 to the lower end of a groove 77 is the same as or larger than the thickness T2 of the device chip 51.

On the other hand, the second cutting unit 72 to which the cutting blade 76 is fitted is used at a time of forming grooves 79 in the sacond planned dividing lines 73b of the wafer 71. Incidentally, it suffices to use the second cutting unit 72 also at a time of forming grooves in the third planned dividing lines 73c.

Figure 13A:
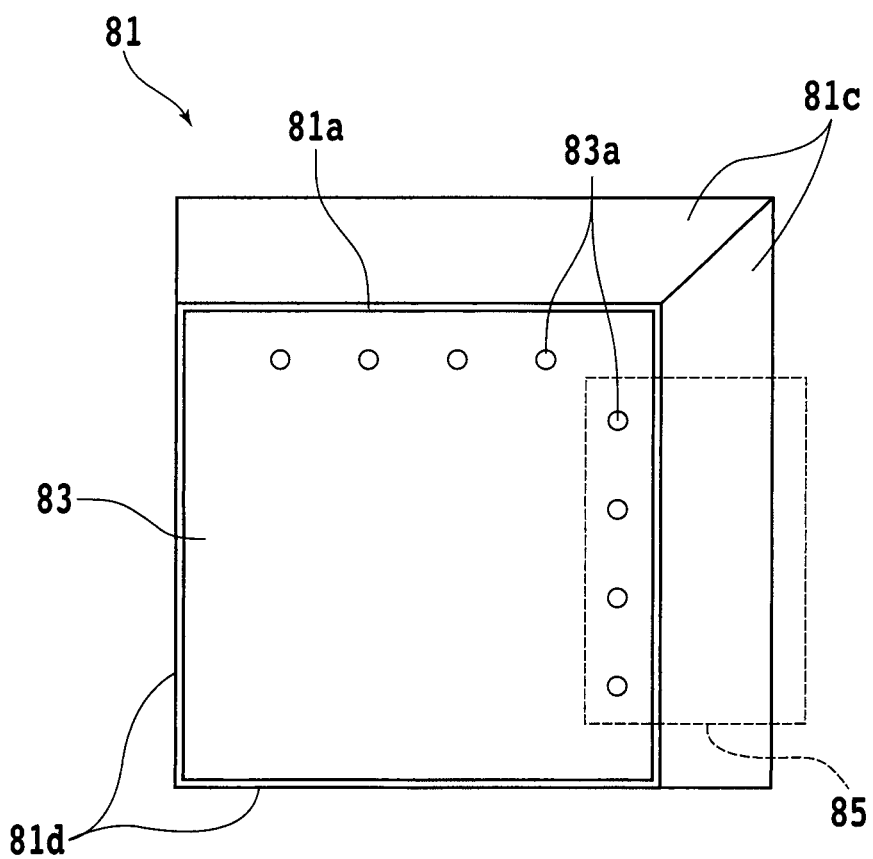
FIG. 13A is a plan view of a device, chip according to a second modification.
Figure 13B:
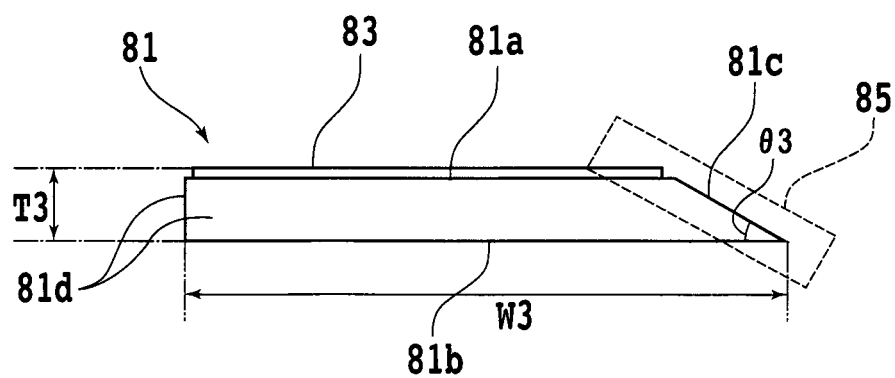
FIG. 13B is a side view of the device chip according to the second modification.

FIG. 13A is a plan view of a device chip according to a second modification. FIG. 13B is a side view of the device chip according to the second modification. As depicted in FIG. 13A and FIG. 13B, a basic structure of the device chip 81 according to the second modification is the same as the structure of the device chip 51 according to the foregoing first modification. However, the device chip 81 according to the second modification has two slopes 81c connected to a top surface 81a and an undersurface 81b and two side surfaces 81d connected to the top surface 81a and the undersurface 81b.

A circuit portion (device) 83 including an electronic circuit is provided to the top surface 81a side of the device chip 81. The circuit portion 83 includes a plurality of terminals 83a exposed to the outside. The plurality of terminals 83a are arranged along edges of the top surface 81a which edges are connected to the slopes 81c. When the device chip 81 is mounted on a flexible board, the terminals 83a of the circuit portion 83 are electrically connected to terminals on the flexible board via wiring.

Together with a region corresponding to the terminals 83a of the circuit portion 83, a part of the slopes 81c constitute wiring portions 85 on which wiring is formed when the device chip 81 is mounted on the flexible board. As described above, the device chip 81 according to the second modification has a rectangular shape as viewed from the top surface 81a side or the undersurface 81b side, and the wiring portions 85 are arranged in regions corresponding to two sides of the rectangle (sides corresponding to the slopes 81c).

There is no particular limitation on an angle 83 formed between the undersurface 81b and the slopes 81c of the device chip 81, the width W3 of the device chip 81, the thickness (finished thickness) T3 of the device chip 81, and the like. For example, the angle θ3, the width W3, and the thickness T3 can be made nearly equal to the angle θ1, the width W1, and the thickness T1 of the device chip 1.

Figure 14A:
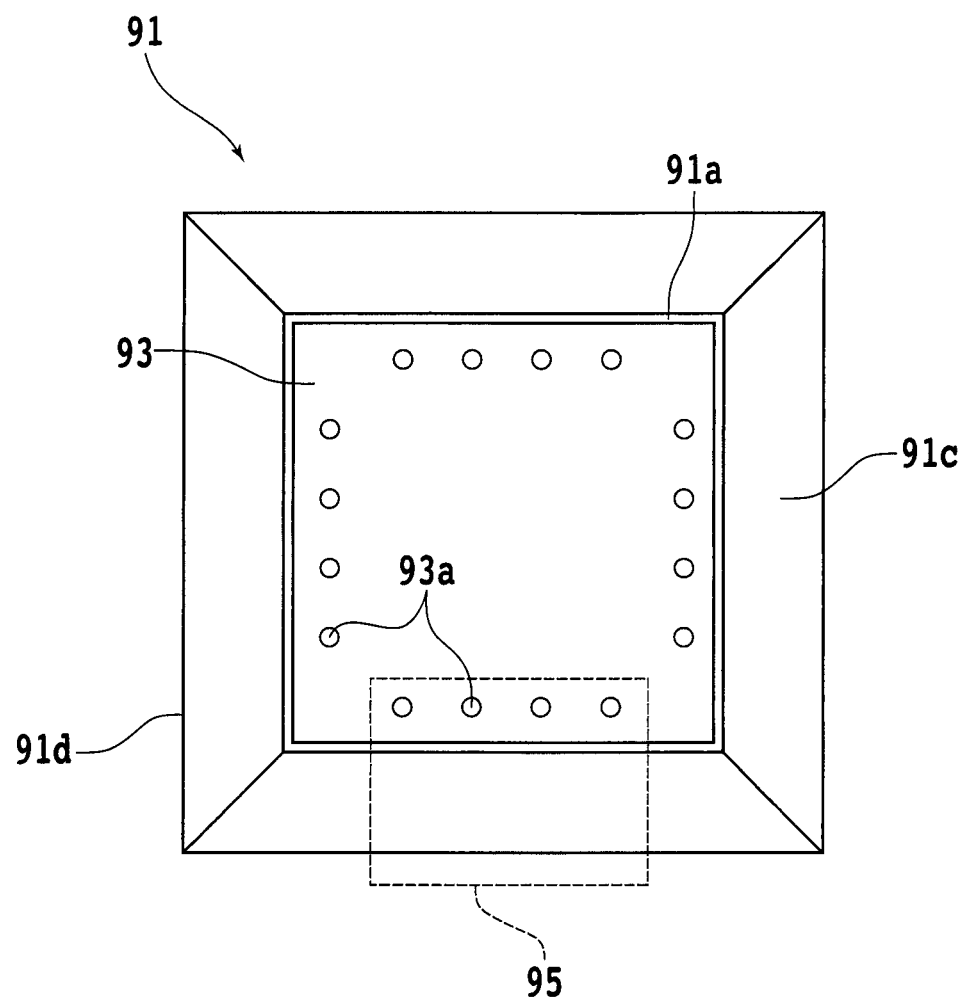
FIG. 14A is a plan view of a device chip according to a third modification.
Figure 14B:
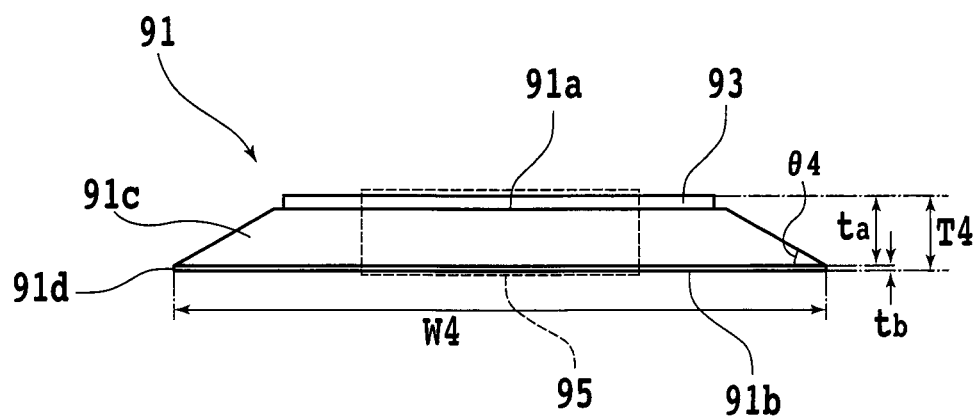
FIG. 14B is a side view of the device chip according to the third modification.

FIG. 14A is a plan view of a device chip according to a third modification. FIG. 14B is a side view of the device chip according to the third modification. As depicted in FIG. 14A and FIG. 14B, a basic structure of the device chip 91 according to the third modification is the same as the structure of the device chip 1 according to the foregoing embodiment. Specifically, the device chip 91 includes a top surface 91a and an undersurface 91b located on an opposite side from the top surface 91a.

The top surface 91a and the undersurface 91b are each formed in substantially a flat rectangular shape. In addition, the top surface 91a and the undersurface 91b are arranged substantially in parallel with each other. The area of the undersurface 91b is larger than the area of the top surface 91a. That is, the area of the top surface 91a is smaller than the area of the undersurface 91b.

A part of an edge of the undersurface 91b, the edge corresponding to one of four sides of the rectangle, is disposed on the side of a part of an edge of the top surface 91a, the edge corresponding to one of four sides of the rectangle. The part of the edge of the top surface 91a and the part of the edge of the undersurface 91b are parallel with each other. The part of the edge of the top surface 91a and the part of the edge of the undersurface 91b are connected to each other via a slope 91c inclined with respect to the top surface 91a and the undersurface 91b and a side surface 91d substantially perpendicular to the top surface 91a and the undersurface 91b.

Specifically, a part of an edge of the slope 91c inclined with respect to the top surface 91a and the undersurface 91b is connected to the part of the edge of the top surface 91a, the edge corresponding to one side of the rectangle. In addition, a part of an edge of the side surface 91d substantially perpendicular to the top surface 91a and the undersurface 91b is connected to the part of the edge of the undersurface 91b, the edge corresponding to one side of the rectangle. Another part of an edge of the slope 91c and another part of an edge of the side surface 91d are connected to each other. The slope 91c is formed so as to be substantially flat, and is exposed only to the top surface 91a side.

Respective parts of edges of the undersurface 91b, the edges corresponding to other three sides of the rectangle, are also arranged on the sides of respective parts of edges of the top surface 91a, the edges corresponding to other three sides of the rectangle. The respective parts of the edges of the top surface 91a are parallel with the respective parts of the edges of the undersurface 91b. The respective parts of the edges of the top surface 91a and the respective parts of the edges of the undersurface 91b are connected to each other via similar slopes 91c and similar side surfaces 91d. That is, the device chip 91 is formed in the shape of a substantially truncated quadrangular pyramid whose shape as viewed from the top surface 91a side or the undersurface 91b side is rectangular, and the device chip 91 includes four slopes 91c and four side surfaces 91d constituting side walls.

A circuit portion (device) 93 including an electronic circuit is provided on the top surface 91a side of the device chip 91. The circuit portion 93 includes a plurality of teminals 93a exposed to the outside. The plurality of terminals 93a are arranged along the respective parts of the edges of the top surface 91a, the edges corresponding to the four sides of the rectangle. When the device chip 91 is mounted on a flexible board, the terminals 93a of the circuit portion 93 are electrically connected to terminals on the flexible board via wiring.

Together with a part of the side surface 91d and a region corresponding to the terminals 93a of the circuit portion 93, a part of the slope 91c constitutes a wiring portion 95 on which wiring is formed when the device chip 91 is mounted on the flexible board. It is to be noted that while FIG. 14A and FIG. 14B depict only the wiring portion 95 corresponding to one slope 91c for the convenience of description, the device chip 91 according to the third modification has a plurality of wiring portions 95 corresponding to the respective slopes 91c.

There is no particular limitation on an angle θ4 formed between a plane parallel with the undersurface 91b of the device chip 91 and the slope 91c, the width W4 of the device chip 91, the thickness (finished thickness) T4 of the device chip 91, and the like. For example, the angle θ4, the width W4, and the thickness T4 can be made nearly equal to the angle θ1, the width W1, and the thickness T1 of the device chip 1.

However, the thickness $t_a$ of a part corresponding to the slope 91c of the device chip 91 (that is, the height difference of the slope 91c) is sufficiently larger than the thickness $t_b$ of a part corresponding to the side surface 91d (that is, the height difference of the side surface 91d). That is, the thickness $t_b$ of the part corresponding to the side surface 91d is sufficiently smaller than the thickness $t_a$ of the part corresponding to the slope 91c. For example, the thickness $t_b$ is preferably equal to or less than 5 μm, and is more preferably equal to or less than 3 μm. In addition, the thickness $t_b$ is preferably equal to or less than ⅓ of the thickness $t_a$, and is more preferably equal to or less than ⅕ of the thickness $t_a$.

Thus, the device chip 91 according to the third modification has the plurality of slopes 91c inclined with respect to the top surface 91a and the undersurface 91b and exposed to the top surface 91a side. In addition, each slope 91c is connected to the top surface 91a, and is connected to the undersurface 91b via the side surface 91d having a sufficiently small height difference as compared with the slope 91c. Therefore, when the device chip 91 is disposed on the flexible board so as to expose the top surface 91a and the slope 91c, almost no level difference occurs between the circuit portion 93 on the top surface 91a side and the slope 91c and between the slope 91c and the flexible board.

Hence, unlike a case of using a device chip having a rectangular parallelepipedic shape (a device chip having only side surfaces substantially perpendicular to a top surface and an undersurface), the circuit portion 93 including the electronic circuit and the flexible board can be reliably connected to each other by merely forming wiring on the wiring portion 95 including the slope 91c by a method such as printing or the like. That is, the device chip 91 according to the third modification is also suitable for formation of wiring by a method such as printing or the like.

The device chip 91 is, for example, manufactured by using the wafer 11 according to the foregoing embodiment. A concrete manufacturing method is as follows, for example. First, the wafer 11 is prepared (preparing step). Then, grooves (first grooves) 17 including slopes (inclined side surfaces) are formed on the top surface 11a side of the wafer 11 by cutting the planned dividing lines 13 of the wafer 11 by a cutting blade (first cutting blade) (first cutting step).

Figure 15A:
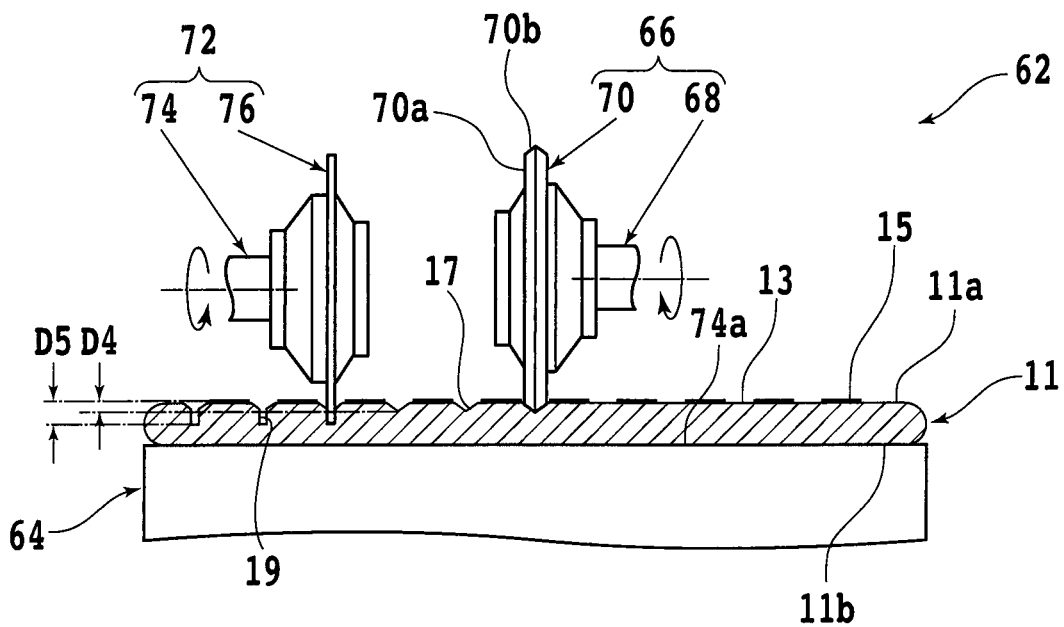
FIG. 15A is a diagram schematically depicting a manner in which grooves are formed on the top surface side of a wafer.

FIG. 15A is a diagran schematically depicting a manner in which the grooves 17 and the like are formed on the top surface 11a side of the wafer 11. In the third modification, the above-described cutting apparatus 62 is used at a time of forming the grooves 17. A concrete procedure is similar to the procedure at a time of forming the grooves 17 in the wafer 11 in the foregoing embodiment.

Specifically, as depicted in FIG. 15A, the planned dividing lines 13 of the wafer 11 are cut from the top surface 11a side by the end portion of the cutting blade (first cutting blade) 70 having, at the end portion thereof, a pair of outer circumferential surfaces 70b inclined with respect to side surfaces 70a. The height of the first cutting unit 66 at the time of cutting the wafer 11 is adjusted such that a distance D4 from the upper surface of a circuit portion 15 to the lower end of a groove 17 is slightly smaller than the thickness T4 of the device chip 91.

After the grooves 17 are formed in the wafer 11, grooves (second grooves) 19 reaching a position deeper from the top surface 11a than the grooves 17 are formed in the wafer 11 by cutting parts corresponding to the lower ends of the grooves 17 (parts corresponding to the planned dividing lines 13) by a cutting blade (second cutting blade). The above-described cutting apparatus 62 is also used at a time of forming the grooves 19.

Specifically, as depicted in FIG. 15A, the planned dividing lines 13 of the wafer 11 are cut from the top surface 11a side by a cutting blade (second cutting blade) 76 having a smaller width (interval between side surfaces) than the end portion (pair of outer circumferential surfaces 70b) of the cutting blade 70. The height of the second cutting unit 72 at the time of cutting the wafer 11 is adjusted such that a distance D5 from the upper surface of a circuit portion 15 to the lower end of a groove 19 is larger than the thickness T4 of the device chip 91.

Thus, the grooves 19 having a smaller width than the grooves 17 and reaching a position deeper from the top surface 11a than the grooves 17 are formed in the wafer 11. Incidentally, while the grooves 19 are formed after the formation of the grooves 17 in this case, the grooves 17 may be formed after the formation of the grooves 19.

After the grooves 17 and the grooves 19 are formed in the wafer 11, the grooves 17 and the grooves 19 are processed from the top surface 11a side by etching (first etching step). In the third modification, the above-described plasma etching apparatus 22 is used to process the grooves 17 and the grooves 19. A concrete procedure is similar to the procedure at a time of processing the grooves 17 from the top surface 11a side by etching in the foregoing embodiment.

A stress remaining in the slopes of the grooves 17 and the side surfaces of the grooves 19 is thereby released (stress relief). Hence, the transverse rupture strength of the device chip 91 is increased. In addition, edges of connecting portions between the top surface 11a of the wafer 11 and the slopes of the grooves 17 and edges of connecting portions between the slopes of the grooves 17 and the side surfaces of the grooves 19 are removed, and the connecting portions are rounded. The device chip 91 therefore also becomes resistant to impacts.

Figure 15B:
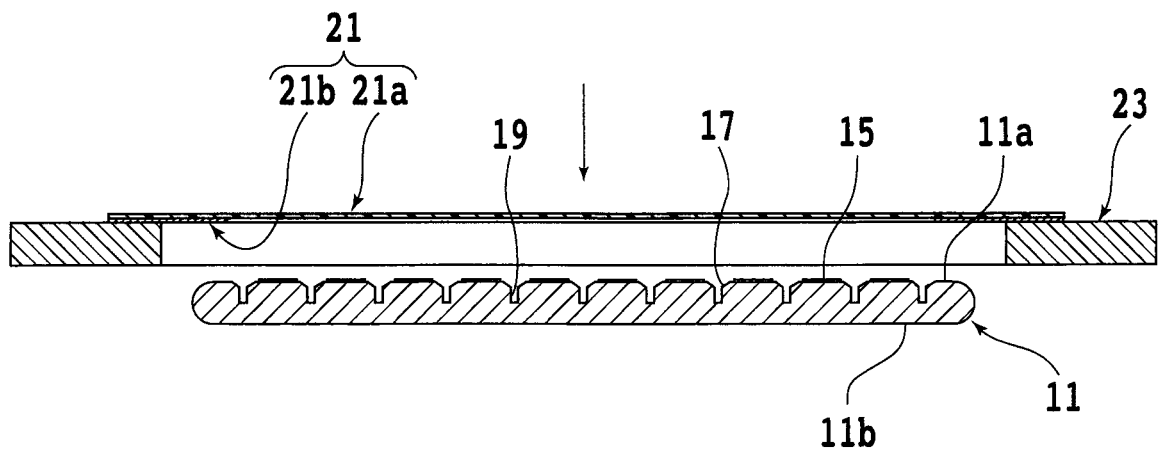
FIG. 15B is a diagram schematically depicting a manner in which a sheet is brought into close contact with the top surface side of the wafer.

A protective member for protecting the top surface 11a side of the wafer 11 is formed after the grooves 17 and the grooves 19 of the wafer 11 are processed from the top surface 11a side by etching (protective member forming step). Specifically, a sheet is first brought into close contact with the top surface 11a side of the wafer 11 (sheet close contact step). FIG. 15B is a diagram schematically depicting a manner in which a sheet 21 is brought into close contact with the top surface 11a side of the wafer 11. A concrete procedure is similar to the procedure at a time of bringing the sheet 21 into close contact with the top surface 11a side of the wafer 11 in the foregoing embodiment.

After the sheet 21 is brought into close contact with the top surface 11a side of the wafer 11, a resin plate 29 covering the sheet 21 is formed (resin plate forming step). Then, the formed resin plate 29 is cut along the outer peripheral edge of the wafer 11 together with the sheet 21, the sheet 25, and the like (cutting step). A circular protective member including the sheet 21, the sheet 25, and the resin plate 29 is thereby completed. A concrete procedure is similar to the procedure according to the foregoing embodiment.

Figure 16A:
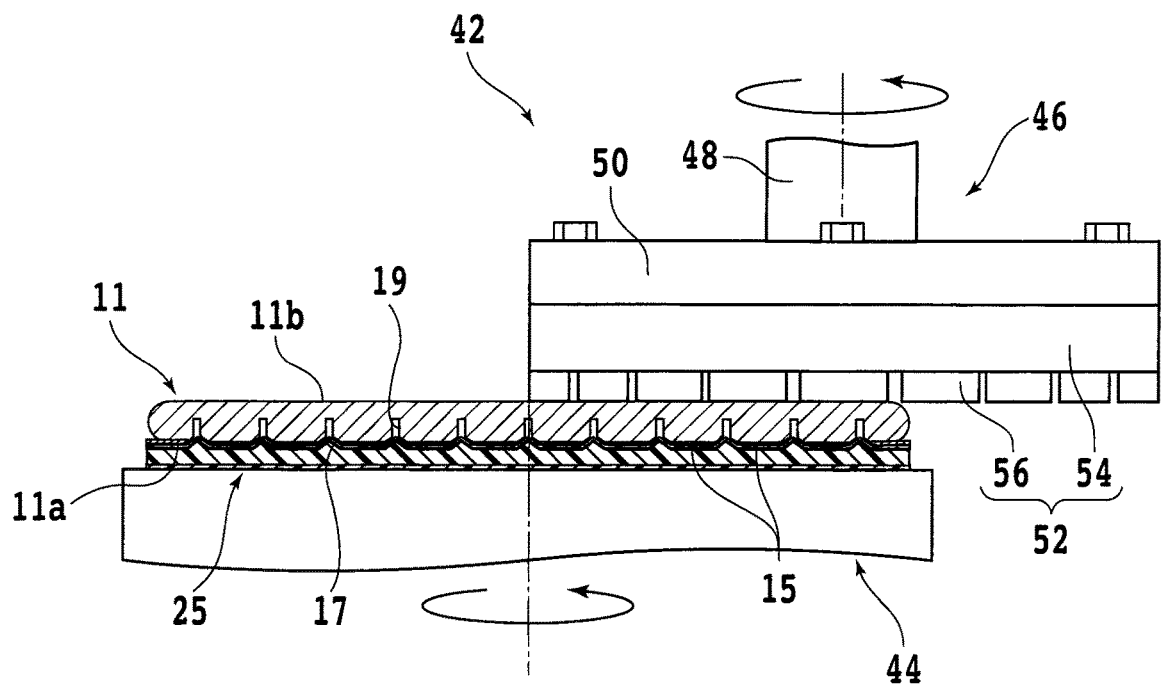
FIG. 16A is a diagram schematically depicting a manner in which the undersurface side of the wafer is ground.

After the protective member is completed, the wafer 11 is thinned by grinding the undersurface 11b of the wafer 11 (grinding step). FIG. 16A is a diagram schematically depicting a manner in which the undersurface 11b side of the wafer 11 is ground. In the present embodiment, the above-described grinding apparatus 42 is used to grind the undersurface 11b side of the wafer 11. A concrete procedure is similar to the procedure at a time of grinding the undersurface 11b of the wafer 11 in the foregoing embodiment.

Thus, the wafer 11 can be thinned by grinding the undersurface 11b side of the wafer 11. In the present embodiment, the wafer 11 is thinned until the side surfaces of the grooves 19 are connected to the undersurface 11b and the wafer 11 is divided into a plurality of device chips 91 and an edge material 97 (see FIG. 16B) with the grooves 19 (planned dividing lines 13) as boundaries. That is, the wafer 11 is thinned to such a degree that the slopes of the grooves 17 are not connected to the undersurface 11b.

Incidentally, the top surface 11a of the wafer 11 becomes the top surface 91a of the device chip 91, the undersurface 11b of the wafer 11 after the grinding becomes the undersurface 91b of the device chip 91, slopes of grooves 17 become the slopes 91c of the device chip 91, and side surfaces of grooves 19 become the side surfaces 91d of the device chip 91.

Figure 16B:
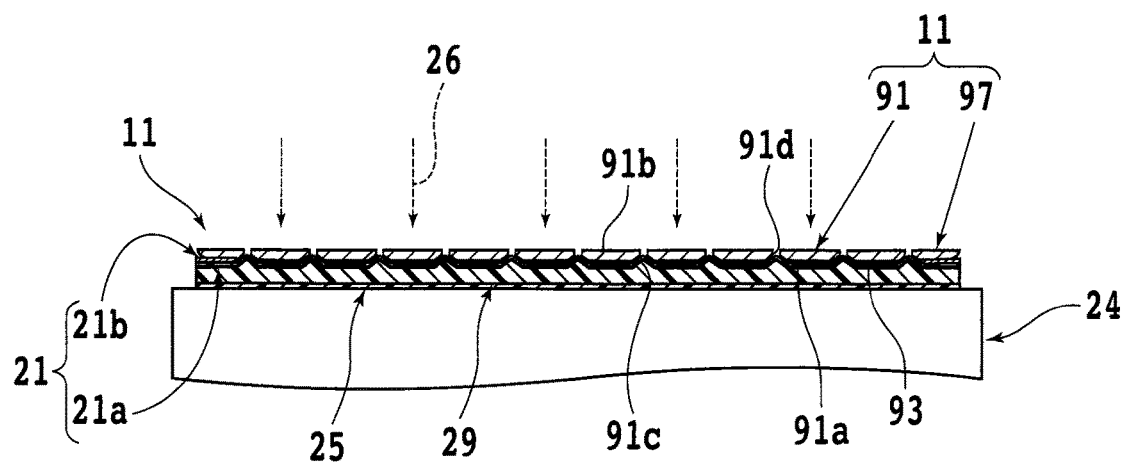
FIG. 16B is a diagram schematically depicting a manner in which the undersurface side of the wafer is processed by etching (plasma etching).

After the undersurface 11b of the wafer 11 is ground, the undersurface 11b of the wafer 11 (the undersurface 91b of the device chip 91) is processed by etching (second etching step). FIG. 16B is a diagram schematically depicting a manner in which the undersurface 11b of the wafer 11 is processed by etching (plasma etching). Also in the third modification, the above-described plasma etching apparatus 22 is used to process the undersurface 11b of the wafer 11.

A concrete procedure is similar to the procedure at a time of processing the undersurface 11b side of the wafer 11 by etching in the foregoing embodiment. A stress remaining in the undersurface 11b of the wafer 11 is consequently released (stress relief). Hence, the transverse rupture strength of the device chip 91 is increased. In addition, because edges of connecting portions between the undersurface 91b of the device chip 91 (the undersurface 11b of the wafer 11) and the side surfaces 91d (the side surfaces of the grooves 19) are removed, and thus the connecting portions are rounded, the device chip 91 also becomes resistant to impacts.

After the undersurface 11b of the wafer 11 is processed by etching, the protective member is removed from the wafer 11 (protective member removing step). A concrete procedure is similar to the procedure at a time of removing the protective member from the wafer 11 in the foregoing embodiment.

In the method of manufacturing the device chip according to the third modification, the grooves 17 including slopes are formed on the wafer by cutting the planned dividing lines 13 by the cutting blade 70, and the grooves 19 having a smaller width than the grooves 17 and reaching a position deeper from the top surface 11a than the grooves 17 are formed by cutting the planned dividing lines 13 by the cutting blade 76.

Then, the wafer 11 is thinned by grinding the undersurface 11b until the side surfaces of the grooves 19 are connected to the undersurface 11b and the wafer 11 is divided into a plurality of device chips 91 with the grooves 19 (planned dividing lines 13) as boundaries.

Therefore, when the wafer 11 is divided into a plurality of device chips 91 by grinding the undersurface 11b, gaps due to the grooves 19 are formed between adjacent device chips 91, and therefore the adjacent device chips 91 do not collide with each other easily. That is, the device chips 91 are not chipped easily at the time of grinding. In addition, the edge portions of the device chips 91 are prevented from becoming too thin as in the case where the grooves 19 are not formed in the wafer 11. A possibility of the device chips 91 being chipped at the time of grinding the undersurface 11b of the wafer 11 can therefore be reduced.

In addition, the grooves 17 can be made shallow as compared with a case where the grooves 19 are not formed. Thus, a width necessary for processing is reduced. That is, the number of device chips 91 taken can be increased by street reduction.

In addition, structures, methods, and the like according to the foregoing embodiment and the modifications can be modified and carried out without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device chip mounted on a board, comprising:
   the device chip that includes:
      a top surface;
      an undersurface located on an opposite side from the top surface and having a larger area than the top surface;
      a slope inclined with respect to the top surface and the undersurface and exposed to the top surface side, wherein the slope connects an outer periphery of the top surface with an outer periphery of the undersurface;
      a circuit portion on the top surface side, the circuit portion including an electronic circuit; and
      a wiring portion on which wiring electrically connecting the circuit portion and the board to each other is to be formed, the wiring portion including the slope in a part of the wiring portion; and
   wherein the board comprises a flexible board mounted to the underside of the device chip, and
   wherein the wiring portion electrically connects a terminal on the circuit portion with a terminal on the flexible board.

2. The device chip according to claim 1, wherein
   the slope is connected to the top surface and the undersurface.

3. The device chip according to claim 1, wherein
   the device chip has a shape of a rectangle as viewed from the top surface side, and
   the wiring portion is disposed in a region corresponding to one side of the rectangle.

4. The device chip according to claim 2, wherein
   the device chip has a shape of a rectangle as viewed from the top surface side, and
   the wiring portion is disposed in a region corresponding to one side of the rectangle.

5. A method of manufacturing a device chip for mounting on a board, the method comprising:
- preparing a wafer having a circuit portion including an electronic circuit in each of a plurality of regions on a side of a top surface demarcated by planned dividing lines;
- forming, in the wafer, a groove including a slope inclined with respect to the top surface and connected to the top surface by cutting the planned dividing lines of the wafer from the top surface side by an end portion of a cutting blade having, at the end portion of the cutting blade, an outer circumferential surface inclined with respect to a side surface; and
- forming the device chip including the slope, the slope being inclined with respect to the top surface and an undersurface located on an opposite side from the top surface of the wafer in which the groove is formed, and the slope being exposed to the top surface side, by thinning the wafer until the slope of the groove and the undersurface are connected to each other and dividing the wafer along the planned dividing lines by grinding the undersurface.

6. The method of manufacturing the device chip according to claim 5, further comprising:
- an etching step of performing etching on the slope of the groove of the wafer, wherein the etching step is performed after the forming of the groove by the cutting blade.

7. The method of manufacturing the device chip according to claim 5, further comprising:
- forming a wiring portion on the slope via printing, wherein the wiring portion is configured and arranged to electrically connect a terminal on the circuit portion with a terminal on the board.

8. The method manufacturing the device chip according to claim 6, wherein the etching step comprises plasma etching that results in a connecting portion between the top surface and the slope of the groove being rounded.

9. A method of manufacturing a device chip for mounting on a board, the method comprising:
- preparing a wafer having a circuit portion including an electronic circuit in each of a plurality of regions on a side of a top surface demarcated by planned dividing lines;
- forming, in the wafer, a groove including a slope inclined with respect to the top surface and connected to the top surface by cutting the planned dividing lines of the wafer from the top surface side by an end portion of a cutting blade having, at the end portion of the cutting blade, an outer circumferential surface inclined with respect to a side surface;
- thinning the wafer by grinding an undersurface located on an opposite side from the top surface of the wafer in which the groove is formed; and
- forming the device chip including the slope inclined with respect to the top surface and the undersurface and exposed to the top surface side by dividing the wafer along the planned dividing lines such that the slope of the groove of the ground wafer and the undersurface of the ground wafer are connected to each other.

10. The method of manufacturing the device chip according to claim 9, wherein
- the wafer is divided along the planned dividing lines by processing the undersurface of the ground wafer by etching.

11. The method of manufacturing the device chip according to claim 9, further comprising:
- an etching step of performing etching on the slope of the groove of the wafer, wherein the etching step is performed after the forming of the groove by the cutting blade.

12. The method of manufacturing the device chip according to claim 9, further comprising:
- forming a wiring portion on the slope via printing, wherein the wiring portion is configured and arranged to electrically connect a terminal on the circuit portion with a terminal on the board.

13. The method of manufacturing the device chip according to claim 10, further comprising:
- an etching step of performing etching on the slope of the groove of the wafer, wherein the etching step is performed after the forming of the groove by the cutting blade.

14. The method manufacturing the device chip according to claim 13, wherein the etching step comprises plasma etching that results in a connecting portion between the top surface and the slope of the groove being rounded.

15. The method manufacturing the device chip according to claim 11, wherein the etching step comprises plasma etching that results in a connecting portion between the top surface and the slope of the groove being rounded.

16. A method of manufacturing a device chip for mounting on a board, the method comprising:
- preparing a wafer having a circuit portion including an electronic circuit in each of a plurality of regions on a side of a top surface demarcated by planned dividing lines;
- forming, in the wafer, a first groove including a slope inclined with respect to the top surface and connected to the top surface by cutting the planned dividing lines of the wafer from the top surface side by an end portion of a first cutting blade having, at the end portion of the first cutting blade, an outer circumferential surface inclined with respect to a side surface;
- forming, in the wafer, a second groove having a smaller width than the first groove and reaching a position deeper from the top surface than the first groove by cutting the planned dividing lines of the wafer from the top surface side by a second cutting blade having a smaller width than the end portion of the first cutting blade; and
- forming the device chip including the slope, the slope being inclined with respect to the top surface and an undersurface located on an opposite side from the top surface of the wafer in which the first groove and the second groove are formed, and the slope being exposed to the top surface side, by thinning the wafer and dividing the wafer along the planned dividing lines by grinding the undersurface.

17. The method of manufacturing the device chip according to claim 16, further comprising:
- an etching step of performing etching on the slope of the first groove of the wafer, wherein the cutting step is performed after the forming of the first groove by the first cutting blade.

18. The method of manufacturing the device chip according to claim 16, further comprising:
- forming a wiring portion on the slope via printing, wherein the wiring portion is configured and arranged to electrically connect a terminal on the circuit portion with a terminal on the board.

19. The method manufacturing the device chip according to claim 17, wherein the etching step comprises plasma etching that results in a connecting portion between the top surface and the slope of the first groove being rounded.

20. A method for manufacturing a device chip and mounting the device chip on a flexible board, the method comprising:
   preparing a wafer having a circuit portion including an electronic circuit in each of a plurality of regions on a side of a top surface demarcated by planned dividing lines;
   forming, in the wafer, a groove including a slope inclined with respect to the top surface and connected to the top surface by cutting the planned dividing lines of the wafer from the top surface side by an end portion of a cutting blade having, at the end portion of the cutting blade, an outer circumferential surface inclined with respect to a side surface;
   thinning the wafer by grinding an undersurface located on an opposite side from the top surface of the wafer in which the groove is formed;
   forming the device chip including the slope inclined with respect to the top surface and the undersurface and exposed to the top surface side by dividing the wafer along the planned dividing lines such that the slope of the groove of the ground wafer and the undersurface of the ground wafer are connected to each other;
   mounting the device chip on the flexible board such that the top surface and the slope of the device chip are exposed upwardly; and
   forming a wiring portion on the slope via printing, wherein the wiring portion electrically connects a terminal on the circuit portion with a terminal on the flexible board.

* * * * *